(12) United States Patent
Debray et al.

(10) Patent No.: US 9,978,905 B2
(45) Date of Patent: *May 22, 2018

(54) SEMICONDUCTOR STRUCTURES HAVING ACTIVE REGIONS COMPRISING INGAN AND METHODS OF FORMING SUCH SEMICONDUCTOR STRUCTURES

(71) Applicant: Soitec, Bernin (FR)

(72) Inventors: Jean-Philippe Debray, Mesa, AZ (US); Chantal Arena, Mesa, AZ (US); Heather McFavilen, Tempe, AZ (US)

(73) Assignee: Soitec, Bernin (FR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/141,472

(22) Filed: Apr. 28, 2016

(65) Prior Publication Data

US 2016/0276530 A1    Sep. 22, 2016

Related U.S. Application Data

(63) Continuation of application No. 14/211,844, filed on Mar. 14, 2014, now Pat. No. 9,343,626.

(Continued)

(51) Int. Cl.
*H01L 33/06* (2010.01)
*H01L 33/32* (2010.01)
(Continued)

(52) U.S. Cl.
CPC .......... *H01L 33/06* (2013.01); *H01L 33/007* (2013.01); *H01L 33/12* (2013.01); *H01L 33/145* (2013.01);
(Continued)

(58) Field of Classification Search
CPC .......... H01L 33/06; H01L 33/16; H01L 33/32
See application file for complete search history.

(56) References Cited

U.S. PATENT DOCUMENTS 6,060,335 A    5/2000  Rennie et al.
6,303,468 B1  10/2001  Aspar et al.
(Continued)

FOREIGN PATENT DOCUMENTS

CN    101273469 A    9/2008
EP       1411559 A2   4/2004
(Continued)

OTHER PUBLICATIONS

Chinese First Notfification of Office Action for Chinese Application No. 201480015148.0 dated Mar. 27, 2017, 7 pages.
(Continued)

*Primary Examiner* — Mark Prenty
(74) *Attorney, Agent, or Firm* — TraskBritt

(57) ABSTRACT

Semiconductor structures include an active region between a plurality of layers of InGaN. The active region may be at least substantially comprised by InGaN. The plurality of layers of InGaN include at least one well layer comprising $In_wGa_{1-w}N$, and at least one barrier layer comprising $In_bGa_{1-b}N$ proximate the at least one well layer. In some embodiments, the value of w in the $In_wGa_{1-w}N$ of the well layer may be greater than or equal to about 0.10 and less than or equal to about 0.40 in some embodiments, and the value of b in the $In_bGa_{1-b}N$ of the at least one barrier layer may be greater than or equal to about 0.01 and less than or equal to about 0.10. Methods of forming semiconductor structures include growing such layers of InGaN to form an active region of a light-emitting device, such as an LED. Luminary devices include such LEDs.

19 Claims, 20 Drawing Sheets

Related U.S. Application Data

(60) Provisional application No. 61/788,441, filed on Mar. 15, 2013.

(51) Int. Cl.
  *H01L 33/00* (2010.01)
  *H01L 33/12* (2010.01)
  *H01L 33/14* (2010.01)
  *H01L 21/02* (2006.01)

(52) U.S. Cl.
  CPC .......... *H01L 33/32* (2013.01); *H01L 21/0254* (2013.01); *H01L 21/0262* (2013.01); *H01L 21/02576* (2013.01); *H01L 21/02579* (2013.01); *H01L 2224/48091* (2013.01); *H01L 2224/48247* (2013.01); *H01L 2224/73265* (2013.01)

(56) References Cited

U.S. PATENT DOCUMENTS

| | | | |
|---|---|---|---|
| 6,335,258 | B1 | 1/2002 | Aspar et al. |
| 6,600,175 | B1 | 7/2003 | Baretz et al. |
| 6,756,286 | B1 | 6/2004 | Moriceau et al. |
| 6,809,044 | B1 | 10/2004 | Aspar et al. |
| 6,946,365 | B2 | 9/2005 | Aspar et al. |
| RE39,484 | E | 2/2007 | Bruel |
| 8,471,243 | B1 | 6/2013 | Arena |
| 8,546,846 | B2 | 10/2013 | Kim et al. |
| 9,117,955 | B2 | 8/2015 | Arena et al. |
| 9,246,057 | B2 | 1/2016 | Debray et al. |
| 9,343,626 | B2 * | 5/2016 | Debray ................ H01L 33/32 |
| 2004/0056259 | A1 | 3/2004 | Goto et al. |
| 2006/0081831 | A1 | 4/2006 | Lee |
| 2010/0109126 | A1 | 5/2010 | Arena |
| 2010/0127353 | A1 | 5/2010 | Letertre et al. |
| 2010/0176490 | A1 | 7/2010 | Letertre et al. |
| 2010/0187496 | A1 | 7/2010 | Yan |
| 2010/0187497 | A1 | 7/2010 | Nago et al. |
| 2010/0320441 | A1 | 12/2010 | Lee |
| 2011/0042645 | A1 | 2/2011 | Lee |
| 2011/0064103 | A1 | 3/2011 | Ohta et al. |
| 2011/0182311 | A1 | 7/2011 | Yoshizumi et al. |
| 2012/0211870 | A1 | 8/2012 | Figuet et al. |
| 2012/0225539 | A1 | 9/2012 | Figuet et al. |
| 2014/0264265 | A1 | 9/2014 | Arena et al. |
| 2014/0264371 | A1 | 9/2014 | Debray et al. |
| 2014/0264408 | A1 | 9/2014 | Debray et al. |
| 2015/0333219 | A1 | 11/2015 | Arena et al. |

FOREIGN PATENT DOCUMENTS

| | | | |
|---|---|---|---|
| EP | 2034525 | A1 | 3/2009 |
| EP | 2058367 | A1 | 5/2009 |
| JP | 2008053760 | A | 3/2008 |
| WO | 2006022497 | A1 | 3/2006 |
| WO | 2006068375 | A1 | 6/2006 |
| WO | 2006101452 | A1 | 9/2006 |
| WO | 2011022724 | A1 | 2/2011 |
| WO | 2014140370 | A1 | 9/2014 |
| WO | 2014140371 | A1 | 9/2014 |

OTHER PUBLICATIONS

Chinese Search Report for Chinese Application No. 201480015148.0 dated Mar. 27, 2017, 2 pages.
Chuang et al., "k•p. Method for Strained Wurtzite Semiconductors," Phys. Rev. B 54, (1996) 2491, Abstract only.
Chuang, Physics of Phonic Devices, 2nd Ed. (Wiley, New Jersey, 2009).
Gorgens et al., Characterization of InGaN Thin Films using High-Resolution X-Ray Diffraction, Applied Physics Letters, vol. 76, No. 5, Jan. 31, 2000, pp. 577-579.
Holec et al, Critical Thickness Calculations for InGaN/GaN, Journal of Crystal Growth, vol. 303, (2007), pp. 314-317.
Leyer et al., The Critical Thickness of InGaN on (0 0 0 1) GaN, Journal of Crystal Growth, vol. 310, (2008), pp. 4913-4915.
Parker et al., Determination of the Critical Layer Thickness in the InGaN/GaN Heterostructures, Applied Physics Letters, vol. 75, No. 18, Nov. 1, 1999, pp. 2776-2778.
Pereira et al., Structural and Optical Properties of InGaN/GaN Layers Close to the Critical Layer Thickness, vol. 81, No. 7, Aug. 12, 2002, pp. 1207-1209.
Son et al., "Numerical Analysis of Efficiency Droop Induced by Piezoelectric Polarization in InGaN/GaN Light Emitting Diodes," Appl. Phys. Lett. 97, (2010), 032109, Abstract only.
Ye et al., Equilibrium Critical Thickness for a Wurtzite InGaN/GaN Heterostructure, Superlattices and Mirostructures (2010), pp. 1-7.
Zhang et al., Improvement in Spontaneous Emission Rates for InGaN Quantum Wells on Ternary InGaN Substrate for Light-Emitting Diodes, Journal of Applied Physics, vol. 110, No. 11, Dec. 1, 2011, p. 113110.
Zhao et al., Theoretical Study on Critical Thicknesses of InGaN Grown on (0 0 0 1) GaN, Journal of Crystal Growth, vol. 327, (2011), pp. 202-204.
International Search Report for International Application No. PCT/EP2014/055314, dated May 21, 2014, 5 pages.
International Search Report for International Application No. PCT/EP2014/055316, dated Jul. 1, 2014, 4 pages.
International Search Report for International Application No. PCT/EP2014/055318, dated May 20, 2014, 5 pages.
International Written Opinion for International Application No. PCT/EP2014/055314, dated May 21, 2014, 9 pages.
International Written Opinion for International Application No. PCT/EP2014/055316, dated Jul. 1, 2014, 4 pages.
International Written Opinion for International Application No. PCT/EP2014/055318, dated May 20, 2014, 6 pages.

* cited by examiner

SEMICONDUCTOR STRUCTURES HAVING ACTIVE REGIONS COMPRISING INGAN AND METHODS OF FORMING SUCH SEMICONDUCTOR STRUCTURES

CROSS-REFERENCE TO RELATED APPLICATIONS

This application is a continuation of U.S. patent application Ser. No. 14/211,844, filed Mar. 14, 2014, now U.S. Pat. No. 9,343,626, issued May 17, 2016, which application claims the benefit of U.S. Provisional Patent Application Ser. No. 61/788,441, filed Mar. 15, 2013, the disclosure of each of which is hereby incorporated herein in its entirety by this reference. The subject matter of this application is also related to the subject matter of U.S. patent application Ser. No. 14/814,044, filed Jul. 30, 2015, now U.S. Pat. No. 9,397,258, issued Jul. 19, 2016, which is a continuation of U.S. patent application Ser. No. 14/211,403, filed Mar. 14, 2014, now U.S. Pat. No. 9,117,955, issued Aug. 25, 2015, which is a utility conversion of U.S. Provisional Patent Application Ser. No. 61/789,792, filed Mar. 15, 2013, to Arena et al. The subject matter of this application is also related to the subject matter of U.S. patent application Ser. No. 14/991,100, filed Jan. 8, 2016, now U.S. Pat. No. 9,634,182, issued Apr. 25, 2017, which is a continuation of U.S. patent application Ser. No. 14/211,590, filed Mar. 14, 2014, now U.S. Pat. No. 9,246,057, issued Jan. 26, 2016, which is a utility conversion of U.S. Provisional Patent Application Ser. No. 61/790,085, filed Mar. 15, 2013, to Debray et al., the disclosure of each of which is incorporated herein in its entirety by this reference.

TECHNICAL FIELD

The present disclosure relates to semiconductor structures and light-emitting devices fabricated from such semiconductor structures that have an active region comprising InGaN, to methods of fabricating such light-emitting devices, and to devices that include such light-emitting devices.

BACKGROUND

Light-emitting devices such as light-emitting diodes (LEDs) are electrical devices that emit electromagnetic radiation in the form of visible light when a voltage is applied across an active region of the LED between an anode and a cathode. LEDs typically comprise one or more layers of semiconductor material, within which electrons supplied from the anode and holes supplied from the cathode recombine. As the electrons and holes recombine within the active region of the LED, energy is released in the form of photons, which are emitted from the active region of the LED.

LEDs may be fabricated to include a wide range of different types of semiconductor materials including, for example, III-V semiconductor materials, and II-V semiconductor materials. The wavelength of the light emitted from any particular LED is a function of the amount of energy released when an electron and a hole recombine. Thus, the wavelength of the light emitted from the LED is a function of relative difference in energy between the energy level of the electron and the energy level of the hole. The energy levels of the electrons and the energy levels of the holes are at least partially a function of the composition of semiconductor materials, the doping type and concentration, the configuration (i.e., crystal structure and orientation) of the semiconductor materials, and the quality of the semiconductor materials within which recombination of the electrons and holes occurs. Thus, the wavelength of the light emitted from an LED may be selectively tailored by selectively tailoring the composition and configuration of the semiconductor materials within the LED.

In is known in the art to fabricate LEDs that comprise III-V semiconductor materials, such as Group III nitride materials. Such Group III nitride LEDs are known to be capable of emitting radiation in the blue and green visible regions of the electromagnetic radiation spectrum, and are known to be capable of operating at relatively high power and luminosity.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes a semiconductor structure comprising a base layer, an active region disposed over the base layer, an electron blocking layer, a p-type $In_pGa_{1-p}N$ bulk layer, and a p-type $In_cGa_{1-c}N$ contact layer. The active region comprises a plurality of layers of InGaN including at least one well layer comprising $In_wGa_{1-w}N$, wherein $0.10 \le w \le 0.40$, and at least one barrier layer comprising $In_bGa_{1-b}N$, wherein $0.01 \le b \le 0.10$. The electron blocking layer is disposed over the active region on a side thereof opposite the base layer. The electron blocking layer comprises $In_eGa_{1-e}N$, wherein $0.00 \le e \le 0.02$. The p-type $In_pGa_{1-p}N$ bulk layer is disposed over the electron blocking layer, and $0.01 \le p \le 0.08$ in the $In_pGa_{1-p}N$ bulk layer. The p-type $In_cGa_{1-c}N$ contact layer is disposed over the p-type $In_pGa_{1-p}N$ bulk layer, and $0.00 \le c \le 0.10$ in the $In_cGa_{1-c}N$ contact layer.

In additional embodiments, the disclosure includes light-emitting devices fabricated from such semiconductor structures.

For example, in some embodiments, the present disclosure includes a light-emitting device that comprises a base layer, an active region disposed over the base layer, an electron blocking layer disposed over the active region, a p-type $In_pGa_{1-p}N$ bulk layer disposed over the electron blocking layer, and a p-type $In_cGa_{1-c}N$ contact layer disposed over the p-type $In_pGa_{1-p}N$ bulk layer. The active region comprises a plurality of layers of InGaN, including at least one InGaN well layer, and at least one InGaN barrier layer disposed directly on the at least one well layer. A critical strain energy of the light-emitting device may be about 1800 (a.u.) or less.

In additional embodiments, the present disclosure includes a method of forming a semiconductor structure that includes providing a base layer, growing a plurality of layers of InGaN to form an active region over the base layer, growing an electron blocking layer over the active region on a side thereof opposite the base layer, growing a p-type $In_pGa_{1-p}N$ bulk layer over the electron blocking layer, wherein $0.01 \le p \le 0.08$, and growing a p-type $In_cGa_{1-c}N$ contact layer over the p-type $In_pGa_{1-p}N$ bulk layer, wherein $0.00 \le c \le 0.10$. Growing the plurality of layers of InGaN includes growing at least one $In_wGa_{1-w}N$ well layer, wherein $0.10 \le w \le 0.40$, and growing at least one $In_bGa_{1-b}N$ barrier layer, wherein $0.01 \le b \le 0.10$.

In yet further embodiments, the present disclosure includes luminary devices that include a container at least substantially transparent to visible wavelengths of electromagnetic radiation, and one or more LEDs as described herein within the container. For example, an LED within the container may include an anode contact, a cathode contact, and an active region between the anode contact and the cathode contact. The active region comprises a plurality of layers of InGaN, and may be at least substantially comprised by InGaN in some embodiments. The plurality of layers of InGaN includes at least one well layer comprising $In_wGa_{1-w}N$, wherein $0.05 \leq w \leq 0.25$, and at least one barrier layer comprising $In_bGa_{1-b}N$ proximate the at least one well layer, wherein $0.01 \leq b \leq 0.10$.

DETAILED DESCRIPTION

The illustrations presented herein are not meant to be actual views of any particular semiconductor material, structure, or device, but are merely idealized representations that are used to describe embodiments of the disclosure.

Figure 1A:
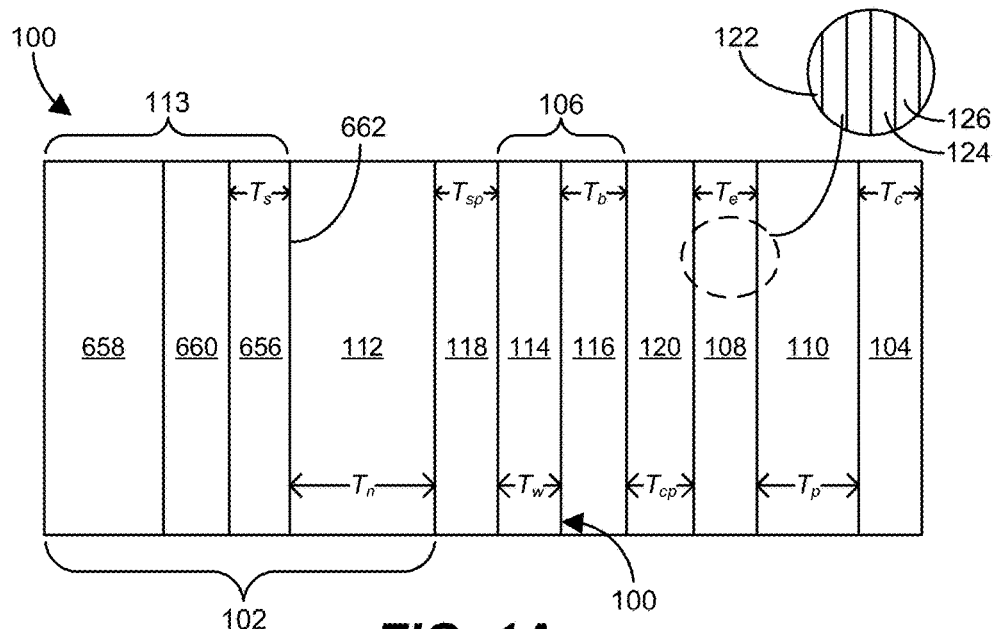
FIG. 1A is a simplified side view of a semiconductor structure that includes one or more InGaN well layers and one or more InGaN barrier layers in an active region of the semiconductor structure in accordance with embodiments of the present disclosure.

FIG. 1A illustrates an embodiment of a semiconductor structure 100. The semiconductor structure 100 comprises a plurality of Group III nitride layers (e.g., indium nitride, gallium nitride, aluminum nitride and their alloys) and includes a base layer 102, a p-type contact layer 104 and an active region 106 disposed between the base layer 102 and the p-type contact layer 104, the active region 106 comprising a plurality of layers of InGaN. In addition, the active region 106 comprises at least one InGaN well layer and at least one InGaN barrier layer. In some embodiments, the active region 106 may be at least substantially comprised by InGaN (but for the presence of dopants). The semiconductor structure 100 further comprises an electron blocking layer 108 disposed over the active region 106, a p-type bulk layer 110 disposed over the electron blocking layer 108 and a p-type contact layer 104 disposed over p-type bulk layer 110.

The base layer 102 may comprise an optional $In_nGa_{1-n}N$ base layer 112, wherein a growth plane of the $In_nGa_{1-n}N$ base layer 112 is a polar plane with a growth plane lattice parameter of greater than or equal to about 3.186 Angstroms. A light-emitting device, such as a light-emitting diode may be fabricated from the semiconductor structure 100, as described in detail subsequently herein. However, in brief, a first electrode contact may be formed over a portion of the base layer 102 and a second electrode contact may be formed over a portion of the p-type contact layer 104, such that an electrical voltage may be supplied between the electrode contacts across the active region 106 thereby causing electromagnetic radiation (e.g., visible light) to be emitted from a light-emitting device fabricated from the semiconductor structure 100.

Embodiments of semiconductor structures of the present disclosure, which include an active region including at least one InGaN well layer and at least one InGaN barrier layer, may be fabricated using various types of methods for growing or otherwise forming Group III nitride layers such as InGaN. As non-limiting examples, the various Group III nitride layers may be grown or otherwise deposited using one or more of a chemical vapor deposition (CVD) process, a metalorganic chemical vapor deposition process (MOCVD), a vapor phase epitaxy (VPE) process, an atomic layer deposition (ALD) process, a hydride vapor phase epitaxy (HVPE) process, a molecular beam epitaxy (MBE) process, a chemical beam epitaxy (CBE) process, etc.

In some embodiments, methods as disclosed in one or all of U.S. Patent Application Publication No. US 2010/0176490 A1, which published Jul. 15, 2010, now U.S. Pat. No. 8,486,771, issued Jul. 16, 2013, in the name of Letertre et al., U.S. Patent Application Publication No. US 2010/0109126, which published May 6, 2010, now U.S. Pat. No. 8,278,193, issued Oct. 2, 2012, in the name of Arena, U.S. Patent Application Publication No. US 2012/0211870, which published Aug. 23, 2012, now U.S. Pat. No. 8,975,165, issued Mar. 10, 2015, in the name of Figuet and U.S. Patent Application Publication No. US 2012/0225539, which published Sep. 6, 2012, now U.S. Pat. No. 8,329,571, issued Dec. 11, 2012, in the name of Figuet, the disclosures of each of which application are hereby incorporated herein in their entirety by this reference, may be used to grow or otherwise deposit the various layers of Group III nitride. Such methods may enable the fabrication of Group III nitride layers, such as InGaN layers (and other optional Group III nitride layers) having compositions and thicknesses as described hereinbelow. Such methods may be utilized to form a growth template 113 upon which subsequent Group III nitride layers may be formed.

An example of such a method that may be used to fabricate the growth template 113, as illustrated in FIG. 1A, according to embodiments of the disclosure is briefly described.

The semiconductor structure 100 of FIG. 1A comprises a plurality of layers of Group III nitride formed on a growth template 113. In some embodiments, the growth template 113 comprises a growth substrate 658 and a GaN seed layer 656 disposed on the growth substrate 658, wherein a growth plane of the GaN seed layer 656 comprises a polar plane. The growth template 113 may further comprise a Group III nitride nucleation layer 660 disposed between the growth substrate 658 and the GaN seed layer 656.

The growth substrate 658 may comprise a homogeneous material or a heterogeneous (i.e., composite) material. By way of non-limiting examples, the growth substrate 658 may comprise sapphire, silicon, Group III-arsenides, quartz ($SiO_2$), fused silica ($SiO_2$) glass, a glass-ceramic composite material (such as, for example, that sold by Schott North America, Inc. of Duryea, Pa. under the trademark ZERODUR®), a fused silica glass composite material (such as, for example, $SiO_2$—$TiO_2$ or $Cu_2$—$Al_2O_3$—$SiO_2$), aluminum nitride (AlN), or silicon carbine (SiC). In some embodiments the growth substrate 658 comprises c-plane sapphire, wherein the growth plane of the sapphire comprises a c-plane.

The Group III nitride nucleation layer 660 may be formed by deposition methods and processes as known in the art, such as a chemical vapor deposition (CVD) process, a metalorganic chemical vapor deposition process (MOCVD), a vapor phase epitaxy (VPE) process, an atomic layer deposition (ALD) process, a hydride vapor phase epitaxy (HVPE) process, a molecular beam epitaxy (MBE) process, an atomic layer deposition (ALD) process, a chemical beam epitaxy (CBE) process, etc.

The Group III nitride nucleation layer 660 may comprise, for example, aluminum nitride (AlN), indium nitride (InN), or gallium nitride (GaN). The Group III nitride nucleation layer 660 may be formed to have an average layer thickness of about one hundred nanometers (100 nm) or less, about twenty nanometers (25 nm) or less, or even about ten nanometers (10 nm) or less. The Group III nitride nucleation layer 660 may also comprise intentional or unintentional dopants. The Group III nitride nucleation layer 660 may be disposed directly on the growth substrate 658 and between the growth substrate 658 and the GaN seed layer 656. The Group III nitride nucleation layer 660 may be formed, for example, by a chemical vapor deposition process carried out at a deposition temperature of about 700° C. or less. Upon the deposition of the Group III nitride nucleation layer 660, the Group III nitride nucleation 660 may be annealed (i.e., heated) at a temperature greater than about 700° C. to improve the crystalline properties of the Group III nitride nucleation layer 660.

The GaN seed layer 656 may be disposed on the growth substrate 658. A growth plane 662 of the GaN seed layer 656 may comprise a polar growth (e.g., a gallium polar or a nitrogen polar) plane. In some embodiments, the growth plane 662 of the GaN seed layer 656 may comprise a gallium polar growth plane. In further embodiments, the GaN seed layer 656 may be formed, for example, by a deposition process, such that the GaN seed layer 656 is formed in a state of tensile strain. In other words, the GaN seed layer 656 may be formed such that the crystal lattice at the growth plane 662 substantially matches the crystal lattice of the growth substrate 658. For example, a lattice constant of the growth plane 662 of the GaN seed layer 656 may have an average lattice value equal to about 3.186 Angstroms.

The GaN seed layer 656 may be formed, for example, by deposition methods and processes as known in the art, such as a chemical vapor deposition (CVD) process, a metalorganic chemical vapor deposition process (MOCVD), a vapor phase epitaxy (VPE) process, an atomic layer deposition (ALD) process, a hydride vapor phase epitaxy (HVPE) process, a molecular beam epitaxy (MBE) process, a chemical beam epitaxy (CBE) process, etc. For example, the GaN seed layer 656 may be formed using a chemical vapor deposition process, wherein the deposition process is performed at a temperature of about 1100° C. or less.

The GaN seed layer 656 may be formed to have an average layer thickness Ts in a range extending from about one micrometer (1 μm) and about seven micrometers (7 μm). As one particular non-limiting example, the average layer thickness Ts may be equal to about four micrometers (4 μm). The GaN seed layer 656 may also comprise intentional or unintentional dopants. For example, the GaN seed layer 656 may be doped n-type by doping with elements that are electron donors, such as silicon or germanium. The concentration of dopants in the GaN seed layer 656 may range from about $3e^{17}$ cm$^{-3}$ to about $1e^{20}$ cm$^{-3}$, or from about $5e^{17}$ cm$^{-3}$ to about $4e^{19}$ cm$^{-3}$. The growth rate of the GaN seed layer 656 may range between about twenty-five nanometers per minute (25 nm/min) and about fifty nanometers per minute (50 nm/min).

The GaN seed layer 656 may be disposed directly on the Group III nitride nucleation layer 660 on a side thereof opposite the growth substrate 658. Therefore, the GaN seed layer 656 may be disposed between the nucleation layer 660 and the active region 106.

In additional embodiments, the growth template 113 may have a structure as described below with reference to FIGS. 6A through 6C, and may be formed using methods as are also described below.

Figure 6A:
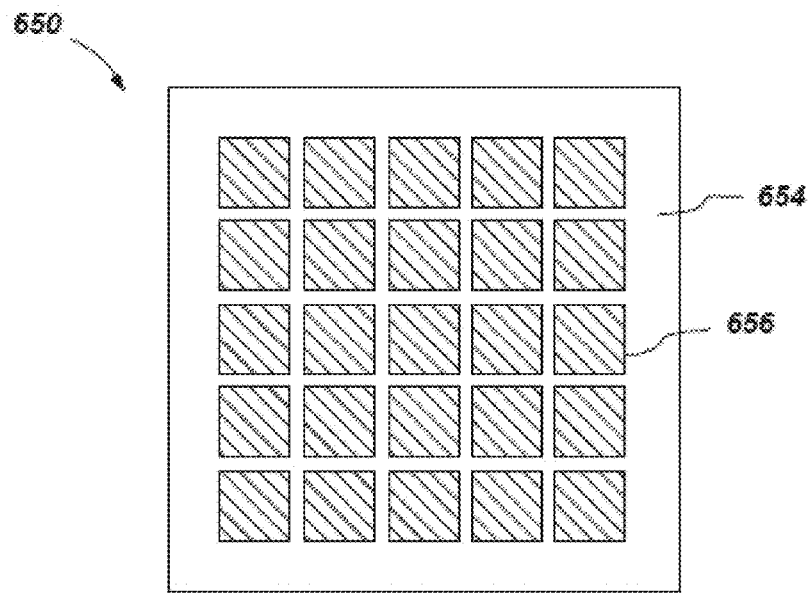
FIG. 6A is a simplified top plan view of an intermediate semiconductor structure that may be employed to fabricate a growth template utilized for fabrication of semiconductor structures in accordance with embodiments of methods of the present disclosure.
Figure 6B:
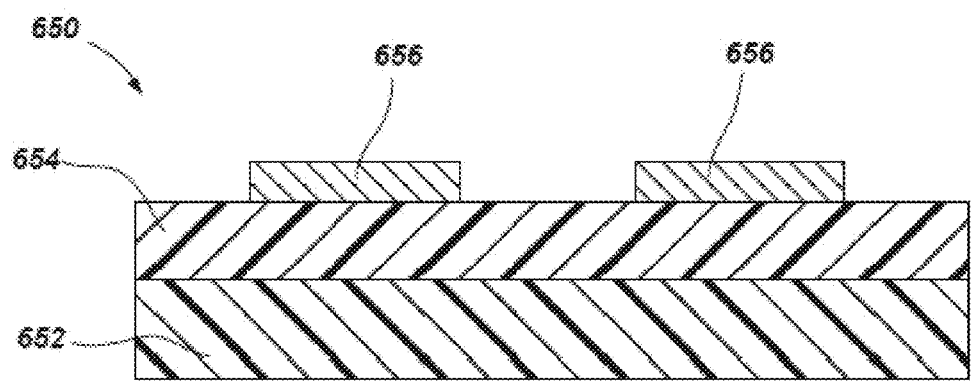
FIG. 6B is a partial cross-sectional side view of the intermediate semiconductor structure of FIG. 6A.

FIG. 6A is a top plan view of an intermediate semiconductor structure 650 utilized in the formation of growth template 113 (of FIG. 6C) on which one or more semiconductor structures and subsequent light-emitting devices of the present disclosure may be fabricated, and FIG. 6B is a simplified cross-sectional view of a portion of the intermediate semiconductor structure 650 utilized in the formation of the growth template 113. The growth template 113 may be fabricated as disclosed in the aforementioned U.S. Pat. No. 8,486,771 and/or U.S. Pat. No. 8,278,193. As disclosed therein, the intermediate semiconductor structure 650 may include a sacrificial substrate 652, a layer of compliant material 654 disposed on the sacrificial substrate 652, and one or more $In_sGa_{1-s}N$ seed layers 656 disposed over the compliant material 654. The one or more $In_sGa_{1-s}N$ seed layers 656 may be used as a "seed" on which the various subsequent layers of the semiconductor structure 100 described herein may be formed.

The initial $In_sGa_{1-s}N$ seed layer may be formed on an initial growth substrate and subsequently transferred to sacrificial substrate 652 utilizing methods such as ion implantation, bonding and subsequent separation of a portion of the initial $In_sGa_{1-s}N$ seed layer (not shown). The initial growth substrate may comprise a growth substrate that is characterized in having a growth plane lattice mismatch with the initial $In_sGa_{1-s}N$ seed layer such that the $In_sGa_{1-s}N$ seed layer is formed in a stained manner. For example, the initial growth substrate may comprise a sapphire substrate including a gallium polar GaN seed layer, such that the $In_sGa_{1-s}N$ seed layer formed comprises a gallium polar $In_sGa_{1-s}N$ seed layer that is subjected to tensile strain. The initial $In_sGa_{1-s}N$ seed layer may be formed or grown such that the $In_sGa_{1-s}N$ seed layer comprises a growth plane that comprises a polar plane of the Group III-nitrides. For example, the growth plane may be formed such that the $In_sGa_{1-s}N$ seed layer comprises a Gallium-polar plane. In addition, the initial $In_sGa_{1-s}N$ seed layer may be grown or otherwise formed such that the composition of the $In_sGa_{1-s}N$ seed layer is such that $0.02 \leq s \leq 0.05$. As one particular non-limiting example, the value of n in the $In_sGa_{1-s}N$ seed layer may be equal to about 0.03. The $In_sGa_{1-s}N$ seed layer also may be grown or otherwise formed to a thickness of greater than about two hundred nanometers (200 nm). The $In_sGa_{1-s}N$ seed layer, however, is formed in such a manner that the $In_sGa_{1-s}N$ seed layer does not surpass the $In_sGa_{1-s}N$ seed layer critical thickness, which is the thickness at which the strain in the $In_sGa_{1-s}N$ seed layer may relax by the formation of additional defects. This phenomenon is commonly referred to in the art as phase separation. Therefore, the $In_sGa_{1-s}N$ seed layer may comprise a strained, high quality seed material.

By way of example and not limitation, the process known in the industry as the SMART CUT® process may be used to transfer the $In_sGa_{1-s}N$ seed layer 656 to the sacrificial substrate 652 utilizing the layer of compliant material 654 as a bonding layer. Such processes are described in detail in, for example, U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al., the disclosures of each of which are incorporated herein in their entireties by this reference.

The sacrificial substrate 652 may comprise a homogeneous material or a heterogeneous (i.e., composite) material. By way of non-limiting examples, the support substrate 652 may comprise sapphire, silicon, Group III-arsenides, quartz ($SiO_2$), fused silica ($SiO_2$) glass, a glass-ceramic composite material (such as, for example, that sold by Schott North America, Inc. of Duryea, Pa. under the trademark ZERODUR®), a fused silica glass composite material (such as, for example, $SiO_2$—$TiO_2$ or $Cu_2$—$Al_2O_3$—$SiO_2$), aluminum nitride (AlN), or silicon carbine (SiC).

The layer of compliant material 654 may comprise, for example, a material having a glass transition temperature ($T_g$) of less than or equal to about 800° C. The layer of compliant material 654 may have a thickness in a range extending from about 0.1 μm to about 10 μm and, more particularly, about 1 μm to about 5 μm. By way of non-limiting example, the layer of compliant material 654 may comprise at least one of an oxide, a phosphosilicate glass (PSG), borosilicate (BSG), a borophosphosilicate glass (BPSG), a polyimide, a doped or undoped quasi-inorganic siloxane spin-on-glass (SOG), an inorganic spin-on-glass (i.e., methyl-, ethyl-, phenyl-, or butyl), and a doped or undoped silicate.

The layer of compliant material 654 may be heated using, for example, an oven, furnace, or deposition reactor, to a temperature sufficient to decrease a viscosity of the layer of compliant material 654 to reflow the layer of compliant material 654 causing the one or more $In_sGa_{1-s}N$ seed layers 656 to at least partially relax the crystal lattice strain. By decreasing the viscosity of the layer of compliant material 654, the tensile strain in the $In_sGa_{1-s}N$ seed layer 656 may be at least partially relaxed or may even be eliminated, thereby forming an $In_sGa_{1-s}N$ seed layer 656 that comprises a growth plane lattice parameter of greater than or equal to about 3.189 Angstroms.

Therefore, by relaxing at least a portion of the lattice strain within the $In_sGa_{1-s}N$, a growth plane lattice parameter may be attained of greater than or equal to about 3.189 Angstroms in the $In_sGa_{1-s}N$. A growth plane lattice parameter of greater than or equal to 3.189 Angstroms may correspond to the equilibrium growth plane lattice constant for wurtzite GaN. Therefore, in accordance with some embodiments of the disclosure, one or more GaN layers formed upon or over the $In_sGa_{1-s}N$ layers of the present disclosure may be formed in a strain free state, i.e., substantially free of lattice strain.

Figure 6C:
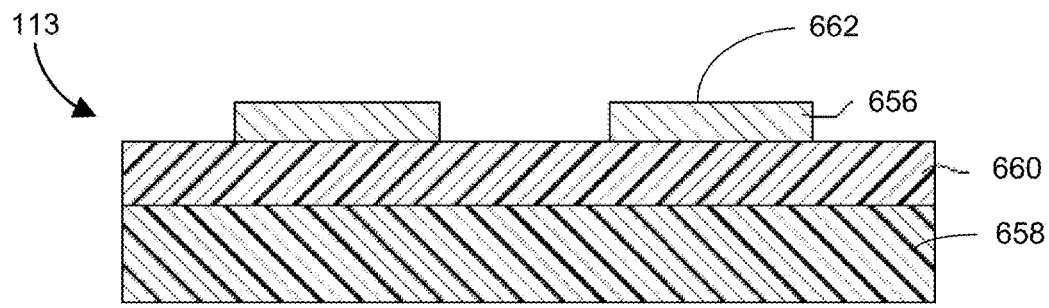
FIG. 6C is a partial cross-sectional side view of a growth template that may be employed to fabricate semiconductor structures in accordance with embodiments of methods of the present disclosure.

Upon at least partial relaxation of the one or more $In_sGa_{1-s}N$ seed layers 656, the $In_sGa_{1-s}N$ seed layers 656 may be transferred to a support substrate, and subsequently the compliant material 654 and sacrificial substrate 652 may be removed to form the growth template 113 as illustrated in FIG. 6C. In greater detail and with reference to FIG. 6B and FIG. 6C, the at least partially relaxed $In_sGa_{1-s}N$ seed layer 656 may be attached to a support substrate 658, and sacrificial substrate 652 and compliant material 654 may be removed utilizing methods such as one or more of laser lift-off, wet etching, dry etching, and chemical mechanical polishing.

The support substrate 658 may comprise a homogeneous material or a heterogeneous (i.e., composite) material. By way of non-limiting examples, the support substrate 658 may comprise sapphire, silicon, Group III-arsenides, quartz ($SiO_2$), fused silica ($SiO_2$) glass, a glass-ceramic composite material (such as, for example, that sold by Schott North America, Inc. of Duryea, Pa. under the trademark ZERODUR®), a fused silica glass composite material (such as, for example, $SiO_2$—$TiO_2$ or $Cu_2$—$Al_2O_3$—$SiO_2$), aluminum nitride (AlN), or silicon carbine (SiC).

In some embodiments, the growth template 113 may optionally include a layer of dielectric material overlying the support substrate 658. The layer of dielectric material may, optionally, be formed over a major surface of the support substrate 658 or the one or more $In_sGa_{1-s}N$ seed layers 656, wherein the dielectric material is utilized as a bonding layer to facilitate the bonding of the $In_sGa_{1-s}N$ seed layer 656 to the support substrate 658. The layer of dielectric material may include, for example, silicon oxynitride (SiON), silicon nitride ($Si_3N_4$), or silicon dioxide ($SiO_2$), and may be formed using, for example, chemical vapor deposition (CVD), physical vapor deposition (PVD), or atomic layer deposition (ALD). Therefore, the growth template 113, as shown in FIG. 6C, comprises a support substrate 658 and an $In_sGa_{1-s}N$ seed layer 656 disposed on the support substrate 658.

In addition, the $In_sGa_{1-s}N$ seed layer 656 may be formed over support substrate 658 such that the composition of the $In_sGa_{1-s}N$ seed layer 656 may range from $0.02 \leq s \leq 0.05$. As one particular non-limiting example, the value of s in the $In_sGa_{1-s}N$ seed layer 656 may be equal to about 0.03. Moreover, the $In_sGa_{1-s}N$ seed layer 656 may have a polar growth plane 662 comprising a growth plane lattice parameter of greater than or equal to about 3.189 Angstroms. The $In_sGa_{1-s}N$ seed layer may also be formed to a total layer thickness $T_s$ of greater than about one hundred nanometers (100 nm).

The growth template 113, as described hereinabove, may form a portion of the base layer 102 of FIG. 1A, and may comprise a growth substrate 658, a Group III nitride nucleation layer 660 and a GaN seed layer 656. The base layer 102 may, in some embodiments, also include an optional $In_nGa_{1-n}N$ base layer 112, wherein the $In_nGa_{1-n}N$ base layer 112 inherits certain crystal properties of the adjacent GaN seed layer 656. Therefore, the $In_nGa_{1-n}N$ base layer 112 may also comprise a polar growth plane, such as a gallium polar growth plane, with a growth plane lattice parameter of great than or equal about 3.186 Angstrom.

The $In_nGa_{1-n}N$ base layer 112 may comprise a layer of $In_nGa_{1-n}N$, wherein $0.00 \leq n \leq 0.10$, or wherein $0.02 \leq n \leq 0.08$. As one particular non-limiting example embodiment, the value of n in the $In_nGa_{1-n}N$ base layer 112 may be equal to about 0.05. The $In_nGa_{1-n}N$ base layer 112 may have an average layer thickness $T_n$ of between about ten nanometers (10 nm) and about three thousand nanometers (3,000 nm), or between about ten nanometers (10 nm) and about one thousand nanometers (1,000 nm). Optionally, the $In_nGa_{1-n}N$ base layer 112 may be doped. For example, the $In_nGa_{1-n}N$ base layer 112 may be doped n-type by doping with elements that are electron donors, such as silicon or germanium. The concentration of dopants in the $In_nGa_{1-n}N$ base layer 112 may range from about $3e^{17}$ $cm^{-3}$ to about $1e^{20}$ $cm^{-3}$, or from about $5e^{17}$ $cm^{-3}$ to about $1e^{19}$ $cm^{-3}$.

A first electrode contact may be formed over at least a portion of the base layer 102 after forming one or more of the other various layers of the semiconductor structure 100 comprising InGaN to fabricate a light-emitting device from semiconductor structure 100.

The completed base layer 102, as shown in FIG. 1A, comprises the growth template 113, as described herein above, and an optional $In_nGa_{1-n}N$ base layer 112. The various Group III nitride layers of the semiconductor structure 100 may be grown or otherwise formed in a layer-by-layer process as described in further detail subsequently herein. In some embodiments, the base layer 102 may comprise a base on which the other layers of the semiconductor structure 100 may be grown or otherwise formed. Thus, the various Group III nitride layers of the semiconductor structure 100 may be grown or otherwise formed sequentially beginning with the base layer 102 and moving in the direction from left to right from the perspective of FIG. 1A, although the semiconductor structure 100 may actually be oriented such that the base layer 102 is disposed on the bottom during fabrication. In other words, the semiconductor structure 100 may be oriented ninety degrees counter-clockwise from the orientation of FIG. 1A during fabrication.

As discussed in further detail below, the active region 106 is disposed between the base layer 102 and the p-type contact layer 104. The active region 106 comprises at least one InGaN well layer 114 and at least one InGaN barrier layer 116. In some embodiments, the active region 106 may be at least substantially comprised by InGaN (but for the presence of dopants). In particular, the active region 106 may comprise at least one well layer 114 comprising $In_wGa_{1-w}N$, wherein $0.10 \leq w \leq 0.40$, or in some embodiments, wherein $0.12 \leq w \leq 0.25$, or in further embodiments, wherein w is equal to about 0.14. The active region 106 also comprises least one barrier layer 116 comprising $In_bGa_{1-b}N$, wherein $0.01 \leq b \leq 0.10$ or in some embodiments wherein $0.03 \leq b \leq 0.08$, or in further embodiments, wherein b is equal to about 0.05. In some embodiments, the InGaN barrier layer 116 may be proximate (e.g., directly adjacent) the at least one InGaN well layer 114.

The active region 106 of the semiconductor structure 100 is the region of the semiconductor structure 100, when fabricated into a light-emitting device such as a light-emitting diode (LED), in which electrons and holes recombine with one another to generate photons, which are emitted from the LED. In some embodiments, the photons are emitted in the form of visible light. At least some of the visible light may have a wavelength or wavelengths within the range of the electromagnetic radiation spectrum extending from about three hundred eighty nanometers (380 nm) to about five hundred sixty nanometers (560 nm).

As previously mentioned, the active region 106 of the semiconductor structure 100 comprises one or more InGaN well layers 114 and one or more InGaN barrier layers 116, and may be at least substantially comprised by InGaN (but for the presence of dopants) in some embodiments. Thus, the active region 106 may consist essentially of InGaN in some embodiments. The active region 106 comprises one or more pairs of adjacent layers that include one well layer 114 and one barrier layer 116, wherein each well layer 114 comprises $In_wGa_{1-w}N$, in which $0.10 \leq w \leq 0.40$, and wherein each barrier layer 116 comprises $In_bGa_{1-b}N$, in which $0.01 \leq b \leq 0.10$.

Figure 1B:
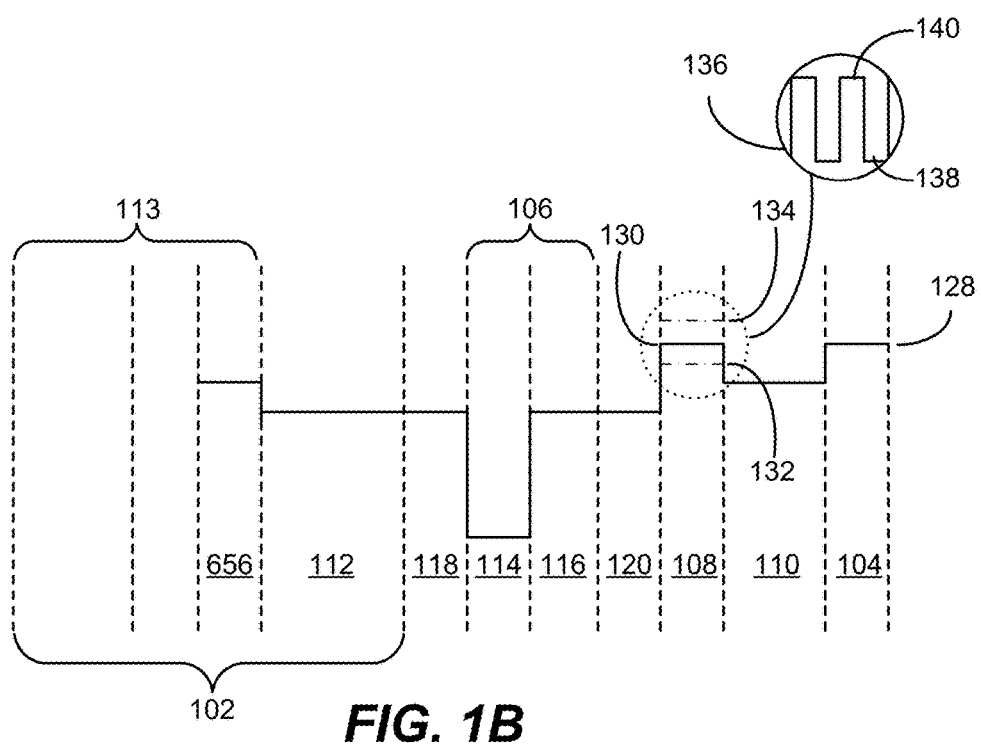
FIG. 1B is a simplified diagram illustrating the relative differences in the energy level of the conduction band in an energy band diagram for the different materials in the various layers of the semiconductor structure of FIG. 1A.

In the embodiment illustrated in FIGS. 1A and 1B, the active region 106 of the semiconductor structure 100 includes one (1) pair of active layers (a well layer 114 and a barrier layer 116), although in additional embodiments, the active region 106 of the semiconductor structure 100 may include more than one pair of active layers. For example, the active region 106 of the semiconductor structure 100 may include from one (1) to twenty-five (25) adjacent pairs of active layers, each pair including a well layer 114 and a barrier layer 116, such that the active region 106 includes a stack of alternating well layers 114 and barrier layers 116 (in embodiments including more than one pair). It is understood however, that the number of barrier layers 116 may not be equal to the number of well layers 114. The well layers 114 may be separated from one another by the barrier layers 116. Thus, the number of barrier layers 116 may be equal to, one more than, or one less than, the number of well layers 114 in some embodiments.

With continued reference to FIG. 1A, each well layer 114 may have an average layer thickness $T_W$ of between about one nanometer (1 nm) and about one thousand nanometers (1,000 nm), between about one nanometer (1 nm) and about one hundred nanometers (100 nm), or even between about one nanometers (1 nm) and about ten nanometers (10 nm). The well layers 114 may comprise quantum wells in some embodiments. In such embodiments, each well layer 114 may have an average layer thickness $T_W$ of about ten nanometers (10 nm) or less. In other embodiments, the well layers 114 may not comprise quantum wells, and each well layer 114 may have an average layer thickness $T_W$ greater than about ten nanometers (10 nm). In such embodiments, the active region 106 may comprise what are referred to in the art as "double heterostructures." Each barrier layer 116 may have an average layer thickness $T_B$ of between about one nanometer (1 nm) and about fifty (50 nm), or even between about one nanometer (1 nm) and about ten nanometers (10 nm), although the barrier layers 116 may be thicker in other embodiments.

One or both of the well layers 114 and the barrier layers 116 may be doped. For example, one or both of the well layers 114 and the barrier layers 116 may be doped n-type by doping with elements that are electron donors, such as silicon or germanium. The concentration of dopants in the well layers 114 may range from about $3e^{17}$ cm$^{-3}$ to about $1e^{19}$ cm$^{-3}$, or may range from about $3e^{17}$ cm$^{-3}$ to about $5e^{17}$ cm$^{-3}$ in some embodiments. Similarly, the concentration of dopants in the barrier layers 116 may range from about $3e^{17}$ cm$^{-3}$ to about $1e^{19}$ cm$^{-3}$, or may range from about $1e^{18}$ cm$^{-3}$ to about $3e^{18}$ cm$^{-3}$ in some embodiments.

One or both of the well layers 114 and the barrier layers 116 may have a Wurtzite crystal structure. Additionally, in some embodiments, one or both of the well layers 114 and the barrier layers 116 may comprise a polar growth surface, such as a gallium polar growth surface, which may have an average lattice constant in the growth plane parallel to the interface or interfaces between the well layers 114 and the barrier layers 116 that is greater than or equal to about 3.186 Angstroms. More specifically, in some embodiments, the average growth plane lattice constant c may be between about 3.186 Angstroms and about 3.2 Angstroms.

The active region 106, comprising at least one well layer and at least one barrier layer, may have an average total thickness ranging between about forty nanometers (40 nm) and about one thousand nanometers (1,000 nm), ranging between about forty nanometers (40 nm) and about seven hundred fifty nanometers (750 nm), or even ranging between about forty nanometers (40 nm) and about two hundred nanometers (200 nm).

With continued reference to FIG. 1A, the semiconductor structure 100 optionally may include additional layers between the active region 106 and the p-type contact layer 104, and/or between the active region 106 and the base layer 102. For example, in some embodiments, the semiconductor structure 100 may comprise a spacer layer 118 between the active region 106 and the base layer 102.

The optional spacer layer 118 may comprise a layer of $In_{sp}Ga_{1-sp}N$, wherein $0.01 \leq sp \leq 0.10$, or wherein $0.03 \leq sp \leq 0.06$, or wherein sp is equal to about 0.05. The spacer layer 118 may be used to provide a more gradual transition between the base layer 102 and the layers of the active region 106, which may have a different composition (and, hence, lattice parameter) relative to the base layer 102, and, in some embodiments, relative to the $In_nGa_{1-n}N$ base layer 112. Thus, the $In_{sp}Ga_{1-sp}N$ spacer layer 118 may be disposed directly between the base layer 102 and the active region 106 in some embodiments. By providing a more gradual transition between the base layer 102 and the active region 106, stresses within the crystal lattice of the various layers of InGaN, and, hence, defects that may result from such stresses, may be reduced. The $In_{sp}Ga_{1-sp}N$ spacer layer 118 may have an average layer thickness $T_{sp}$ of between about one nanometer (1 nm) and about one hundred nanometers (100 nm), or between about one nanometer (1 nm) and about one hundred nanometers (25 nm). As one particular non-limiting example, the average layer thickness $T_{sp}$ may be equal to about ten nanometers (10 nm).

Optionally, the $In_{sp}Ga_{1-sp}N$ spacer layer 118 may be doped. For example, the $In_{sp}Ga_{1-sp}N$ spacer layer 118 may be doped n-type by doping with elements that are electron donors, such as silicon or germanium. The concentration of dopants in the spacer layer 118 may range from about $3e^{17}$ cm$^{-3}$ to about $1e^{19}$ cm$^{-3}$. As one particular non-limiting example, the concentration of dopants in the spacer layer 118 may be equal to about $2e^{18}$ cm$^{-3}$.

With continued reference to FIG. 1A, the semiconductor structure 100 may further include an optional $In_{cp}Ga_{1-cp}N$ cap layer 120 disposed between the active region 106 and the p-type contact layer 104. The optional $In_{cp}Ga_{1-cp}N$ cap layer 120 may comprise a layer of $In_{cp}Ga_{1-cp}N$, wherein $0.01 \leq cp \leq 0.10$, or wherein $0.03 \leq cp \leq 0.07$. As one particular non-liming example, the value of cp may be equal to about 0.05. The $In_{cp}Ga_{1-cp}N$ cap layer 120 may be used to avoid the dissolution and/or evaporation of indium in the underlying layers of the active region 106 upon subsequent processing at elevated temperatures, and/or may serve the same function of a spacer layer.

The $In_{cp}Ga_{1-cp}N$ cap layer 120 may have an average layer thickness $T_{cp}$ of between about one nanometer (1 nm) and about one hundred nanometers (100 nm), or between about one nanometer (1 nm) and about twenty-five nanometers (25 nm). As one particular non-limiting example, $T_{cp}$ may be equal to about ten nanometers (10 nm) in some embodiments. Optionally, the cap layer 120 may be doped. For example, the cap layer 120 may be doped p-type by doping with elements that are electron acceptors, such as magnesium, zinc, and carbon. In other embodiments, however, the cap layer 120 may be doped n-type. The concentration of dopants in the cap layer 120 may range from about $3e^{17}$ $cm^{-3}$ to about $1e^{19}$ $cm^{-3}$, or may range from about $1e^{18}$ $cm^{-3}$ to about $5e^{18}$, $cm^{-3}$. As one particular non-limiting example, the concentration of dopants in the cap layer 120 may be equal about $2e^{18}$ $cm^{-3}$ in some embodiments.

The semiconductor structure 100 of the present disclosure may further include one or more electron blocking layers (EBLs) disposed between the active region 106 and the p-type contact layer 104. Such electron blocking layers may comprise a material in which the energy level of the band edge of the conduction band is relatively high compared to the band edge in the conduction band in the active region 106, which may serve to confine electrons within the active region 106 and prevent carriers from over flowing out from the active region 106.

As a non-limiting example, FIG. 1A illustrates an electron blocking layer 108 disposed on a side of the cap layer 120 opposite the active region 106. In embodiments including a p-type bulk layer 110, as shown in FIG. 1A, the electron blocking layer 108 may be disposed directly between the cap layer 120 and the p-type bulk layer 110.

The electron blocking layer 108 comprises a Group III nitride. As a non-limiting example, the electron blocking layer 108 may be at least substantially comprised by $In_eGa_{1-e}N$ (but for the presence of dopants), wherein $0.00 \le e \le 0.02$ and may, in some embodiments, be at least substantially comprised by GaN (but for the presence of dopants). In further embodiments, the electron blocking layer 108 may be at least substantially comprised by $Al_eGa_{1-e}N$, wherein $0.00 e \le 0.20$. In some embodiments, the electron blocking layer 108 may be at least substantially comprised by $Al_eGa_{1-e}N$ (but for the presence of dopants).

The electron blocking layer 108 may be doped p-type with one or more dopants selected from the Group consisting of magnesium, zinc, and carbon. A concentration of the one or more dopants within the electron blocking layer 108 may be in a range extending from about $1e^{17}$ $cm^{-3}$ to about $1e^{21}$ $cm^{-3}$, or in some embodiments, may be equal to about $3e^{19}$ $cm^{-3}$. In some embodiments, the electron blocking layer 108 may have an average layer thickness $T_e$ in a range extending from about five nanometers (5 nm) to about fifty nanometers (50 nm), or may, in some embodiments, have an average layer thickness $T_e$ equal to about twenty nanometers (20 nm).

In further embodiments of the semiconductor structure 100 of the present disclosure, the semiconductor structure 100 may have an electron blocking layer, similar to the electron blocking layer 108, but wherein the electron blocking layer has a superlattice structure comprising alternating layers of different materials, as illustrated in the inset 122 of FIG. 1A. For example, the electron blocking layer 108 may have a superlattice structure comprising alternating layers of GaN 124 and $In_eGa_{1-e}N$ 124 wherein $0.01 \le e \le 0.02$. In further embodiments, the electron blocking layer may have a superlattice structure comprising alternating layers of GaN 124 and $Al_eGa_{1-e}N$ 126, wherein $0.01 \le e \le 0.20$. Each of the layers in such superlattice structures may have an average layer thickness of from about one nanometer (1 nm) to about twenty nanometers (20 nm).

As previously mentioned, the semiconductor structure 100 of the present disclosure may further include a p-type bulk layer 110 disposed between the electron blocking layer 108 and the p-type contact layer 104. Such p-type bulk layers may comprise a p-doped Group III nitride material, such as p-doped $In_pGa_{1-p}N$. Such p-type bulk layers may be used, for example, as a source of hole carriers and to enhance the electrical conduction and light extraction to and from the active region 106.

The p-type bulk layer 110 may be at least substantially comprised by $In_pGa_{1-p}N$, wherein $0.01 \le p \le 0.08$ (but for the presence of dopants). As one particular non-limiting example, the p-type bulk layer 110 may be at least substantially comprised by $In_pGa_{1-p}N$, wherein p is equal to about 0.02. The p-type bulk layer 110 may be doped p-type with one or more dopants selected from the Group consisting of magnesium, zinc, and carbon. A concentration of the one or more dopants within the p-type bulk layer 110 may be in a range extending from about $1e^{17}$ $cm^{-3}$ to about $1e^{21}$ $cm^{-3}$. As one particular non-limiting example, the concentration of dopants in the p-type bulk layer 110 may be equal to about $3e^{19}$ $cm^{-3}$. In some embodiments, the p-type bulk layer 110 may have an average layer thickness $T_p$ in a range extending from about fifty nanometers (50 nm) to about six hundred nanometers (600 nm). As one particular non-limiting example, the p-type bulk layer 110 may have an average layer thickness $T_p$ equal to about one hundred seventy-five nanometers (175 nm).

The semiconductor structure 100 may further include a p-type contact layer 104 disposed on a side of the p-type bulk layer 110 opposite the electron blocking layer 108. The p-type contact layer 104 may comprise a Group III nitride. Such p-type contact layers may be used, for example, to enhance the conduction of holes into the active region 106. The p-type contact layer 104 may comprise a higher concentration of one or more dopants, such as p-type dopants, so as to limit the electrical resistance of an electrode contact formed over a portion of the p-type contact layer 104 during the fabrication of a light-emitting device from semiconductor structure 100.

As a non-limiting example, the p-type contact layer 104 may comprise $In_cGa_{1-c}N$ that is doped p-type. For example, the p-type contact layer 104 may be at least substantially comprised by $In_cGa_{1-c}N$, wherein $0.01 \le c \le 0.10$ (but for the presence of dopants), and, in some embodiments, the p-type contact layer 104 may be at least substantially comprised by GaN (but for the presence of dopants). The p-type contact layer 104 may be doped p-type with one or more dopants selected from the Group consisting of magnesium, zinc, and carbon. A concentration of the one or more dopants within the p-type contact layer 104 may be in a range extending from about $1e^{17}$ $cm^{-3}$ to about $1e^{12}$ $cm^{-3}$. As one particular non-limiting example, the concentration of the one or more dopants within the p-type contact layer 104 may be equal to about $1e^{20}$ $cm^{-3}$. The p-type contact layer 104 may have an average layer thickness $T_c$ in a range extending from about two nanometers (2 nm) to about fifty nanometers (50 nm). As one particular non-limiting example, the p-type contact layer 104 may have an average layer thickness $T_c$ equal to about fifteen nanometers (15 nm). As shown in FIG. 1A, the p-type contact layer 104 may be formed directly on the p-type bulk layer 110.

As described in greater detail hereinbelow, the completed semiconductor structure 100 may be utilized in the fabrication of one or more semiconductor light-emitting devices, such as an LED. In brief, an electrode contact may be formed over a portion of the semiconductor layers of the base layer 102, such as over a portion of an $In_nGa_{1-n}N$ base layer 112 or at least a portion of the GaN seed layer 656, and a further electrode contact may be formed over at least a portion the p-type contact layer 104, thereby allowing charge carriers to be injected into the active region 106 with a resultant emission of electromagnet radiation, which may be in the form of visible light.

FIG. 1B is a simplified diagram illustrating the relative differences in the energy level of the conduction band 128 (in an energy band diagram) for the different semiconductor materials in the various layers of the semiconductor structure 100 of FIG. 1A (note the growth substrate 658 and the Group III nitride nucleation layer 660 are omitted). FIG. 1B is vertically aligned with the semiconductor structure 100 of FIG. 1A. The vertical dashed lines in FIG. 1B are aligned with the interfaces between the various layers in the semiconductor structure 100 of FIG. 1A. The vertical axis in FIG. 1B is energy, with higher energy levels being located vertically above lower energy levels. It should be noted that FIG. 1B illustrates a non-limiting example of the conduction band energy levels for an example semiconductor structure 100. As a result, the relative horizontal conduction band energy levels may alter in relative position as a function of at least the composition and doping of the individual semiconductor layers, the composition ranges of the various semiconductors layers ranging as described hereinabove. Thus, FIG. 1B may be used to see the relative differences in the energy levels of the conduction band 128 in the various layers of the semiconductor structure 100. As shown in FIG. 1B, the energy level of the conduction band 128 in the well layer 114 may be lower than the energy level of the conduction band 128 in other layers of the semiconductor structure 100.

As known in the art, for Group III nitride layers such as InGaN, the energy level of the conduction band 128 is a function of multiple variables, including, but not limited to, indium content and dopant levels. The well layers 114 and the barrier layers 116 may be formed to have a composition and otherwise configured such that the energy level of the conduction band 128 in the well layers 114 is lower than the energy level of the conduction band 128 in the barrier layers 116. As a result, charge carriers (e.g., electrons) may be accumulated in the well layers 114 during operation of a light-emitting device fabricated from the semiconductor structure 100, and the barrier layers 116 may serve to impede migration of charge carriers (e.g., electrons) across the active region 106. Thus, in some embodiments, the indium content in each well layer 114 may be higher than the indium content in each barrier layer 116. For example, a difference between the indium content in each well layer 114 and the indium content in each barrier layer 116 may be greater than or equal to about 0.05 (i.e., w−b≥0.05), or in some embodiments may be greater than or equal to about 0.20 (i.e., w−b≥0.20). In some embodiments, the dopant concentration in the barrier layers 116 may be different than the dopant concentration in the well layers 114. High doping concentrations may result in defects in the crystal structure of InGaN, and such defects may result in non-radiative combinations of electron-hole pairs. In some embodiments, the dopant concentration in the well layers 114 may be lower than the dopant concentration in the barrier layers 116 to reduce a rate of non-radiative combinations of electron-hole pairs in the well layers 114 relative to the rate of non-radiative combinations of electron-hole pairs in the barrier layers 116. In other embodiments, the dopant concentration in the barrier layers 116 may be higher than the dopant concentration in the well layers 114.

As illustrated in FIG. 1B, the energy barrier provided by the electron blocking layer 108 may result from the difference in the energy level of the conduction band 128 in the electron blocking layer 108 and the cap layer 120 (or other layer immediately adjacent the electron blocking layer 108 on the side thereof closest to the active region 106). The height of the energy barrier may be altered by altering the composition of the electron blocking layer 108. For example, as illustrated in FIG. 1B, the conduction energy level 130 (shown as a solid line) may illustrate the conduction band energy level for an electron blocking layer at least substantially comprised by GaN (but for the presence of dopants). The conduction band energy level within the electron blocking layer may be reduced relative to a GaN electron blocking layer, as illustrated by conduction band energy level 132 (shown as dashed line) by forming an electron blocking layer at least substantially comprised by $In_eGa_{1-e}N$, wherein 0.01≤e≤0.02. In further embodiments, the conduction band energy level may be increased, relative to a GaN electron blocking layer, as illustrated by conduction band energy level 134 (shown as dashed line) by forming an electron blocking layer at least substantially comprised by $Al_eGa_{1-e}N$, wherein 0.01≤e≤0.20. Therefore the energy level of the conduction band within the electron blocking layer may be to altered to provide a desired conduction band off-set between the electron blocking layer 108 and the other Group III nitride layers of semiconductor structure 100.

In embodiments of the semiconductor structure 100 in which the electron blocking layer 108 has a superlattice structure comprising alternating layers of different materials, the conduction band energy level may increase and decrease in a periodic like manner as illustrated in the inset 136 of FIG. 1B. For example, the electron blocking layer 108 may have a superlattice structure comprising alternating layers of GaN 138 and $Al_eGa_{1-e}N$ 140, wherein 0.01≤e≤0.20, or alternatively, the superlattice structure may comprise alternating layers of GaN and $In_eGa_{1-e}N$, wherein 0.01≤e≤0.02. The magnitude of the conduction band energy off-set between the alternating layers of different materials may be selected by the compositional difference between the GaN layers and the $Al_eGa_{1-e}N$ or $In_eGa_{1-e}N$ layers.

Semiconductor structures of the present disclosure may further include electron stopping layers disposed between the active region 106 of the semiconductor structure and the base layer 102 of the semiconductor structure. Such electron stopping layers may comprise an n-doped Group III nitride material in which the energy level of the band edge of the conduction band is relatively higher compared to the band edge in the conduction band in the $In_nGa_{1-n}N$ base layer, which may serve to further confine electrons within the active region and may prevent overflow of carriers from the active region, thereby providing an improved uniformity of carriers within the active region.

Figure 2A:
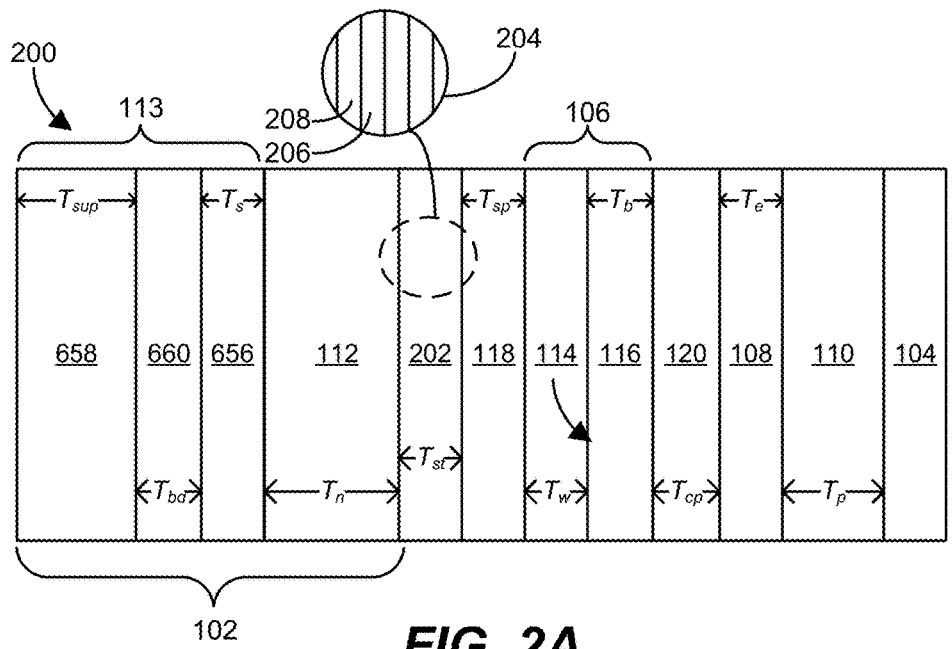
FIG. 2A is a simplified side view of another semiconductor structure similar to the semiconductor structure of FIG. 1A, but further including an electron stopping layer between an active region and a base layer of the semiconductor structure.
Figure 2B:
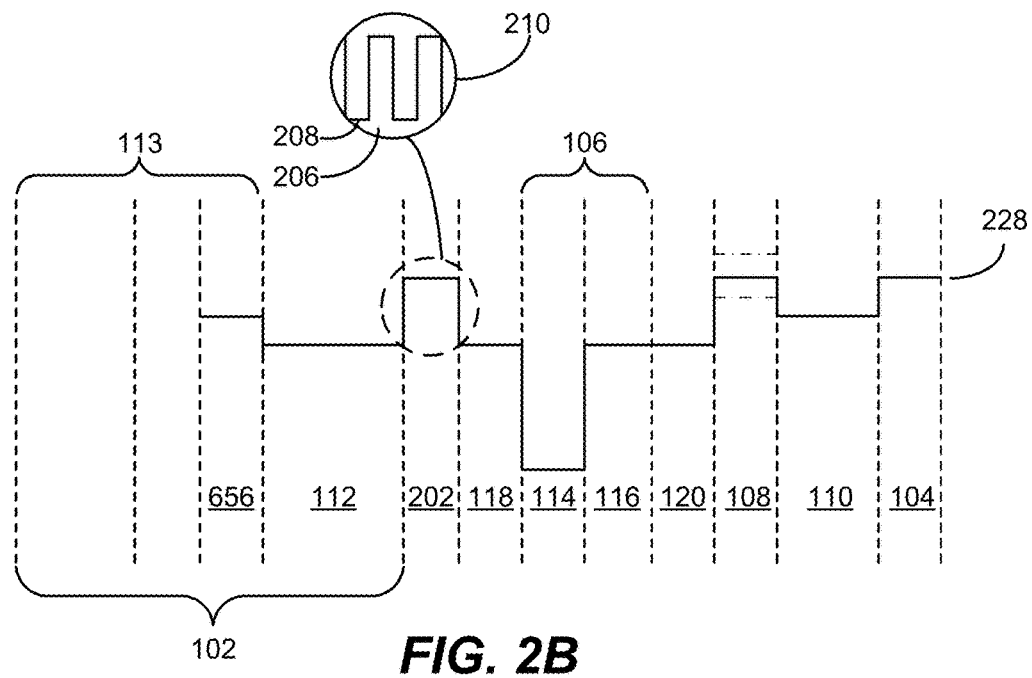
FIG. 2B is a simplified conduction band diagram for the semiconductor structure of FIG. 2A.

As a non-limiting example, FIGS. 2A and 2B illustrate an embodiment of a semiconductor structure 200 that includes such an electron stopping layer 202. The semiconductor structure 200 is similar to semiconductor structure 100 and includes an active region 106 comprising one or more InGaN well layers 114 and one or more InGaN barrier layers 116 as previously described in relation to the semiconductor structure 100. The semiconductor structure 200 also includes a base layer 102, a spacer layer 118, a cap layer 120, an electron blocking layer 108, a p-type bulk layer 110 and a p-type contact layer 104 as previously described in relation to the semiconductor structure 100. The electron stopping layer 202 of the semiconductor structure 200 is disposed between the base layer 102 and the active region 106, and may be disposed between the $In_nGa_{1-n}N$ base layer 112 and the spacer layer 118.

The electron stopping layer 202 comprises a Group III nitride. As a non-limiting example, the electron stopping layer 202 may comprise AlGaN that is doped n-type. For example, in some embodiments, the electron stopping layer 202 may be at least substantially comprised by $Al_{st}Ga_{1-st}N$ (but for the presence of dopants), wherein $0.01 \leq st \leq 0.20$. In other embodiments, the electron stopping layer 202 may have a superlattice structure, as illustrated in inset 204, comprising alternating layers of $Al_{st}Ga_{1-st}N$ 206, wherein $0.01 \leq st \leq 0.20$, and layers of GaN 208. The semiconductor structure 200 may include any number (e.g., from about one (1) to about twenty (20)) of alternating layers of $Al_{st}Ga_{1-st}N$ 206 and layers of GaN 208. The layers 206 and 208 in such a superlattice structure may have an average layer thickness of from about one nanometer (1 nm) to about one hundred nanometers (100 nm).

The electron stopping layer 202 may be doped n-type with one or more dopants selected from the Group consisting of silicon and germanium. A concentration of the one or more dopants within the electron stopping layer 202 may be in a range extending from about $0.1e^{18}$ cm$^{-3}$ to $20e^{18}$ cm$^{-3}$. In some embodiments, the electron stopping layer 202 may have an average layer thickness $T_{st}$ in a range extending from about one nanometer (1 nm) to about fifty nanometers (50 nm).

FIG. 2B is a simplified conduction band diagram and illustrates the relative energy levels of the conduction band 228 for the various materials in the semiconductor structure 200. As shown in FIG. 2B, in the embodiment of the semiconductor structure 200 of FIG. 2A, the energy level of the conduction band 228 within at least a portion of the electron stopping layer 202 of the semiconductor structure 200 (FIG. 2B) may be relatively higher than the energy level of the conduction band 228 within the base layer 102 and/or the energy level of the conduction band 228 within the spacer layer 118. In embodiments wherein the electron stopping layer 202 comprises a superlattice structure, as illustrated in the inset 210 of FIG. 2B, comprising alternating layers of $Al_{st}Ga_{1-st}N$ 206, wherein $0.01 \leq st \leq 0.20$, and layers of GaN 208, the conduction band energy level may vary in periodic manner.

In additional embodiments, semiconductor structures of the present disclosure may include one or more layers of material between the active region and the base layer 102 that are employed to facilitate fabrication of the semiconductor structure. For example, in some embodiments, the semiconductor structure, and the one or more light-emitting devices fabricated from such structures, of the present disclosure may include one or more strain relief layers disposed between the active region and the base layer 102, wherein the strain relief layers are composed and configured to accommodate strain in the crystal lattice of the crystal structures of the various layers of the semiconductor structure between the base layer 102 and the p-type contact layer, which layers may be grown epitaxially one upon one another in a layer-by-layer process.

Figure 3A:
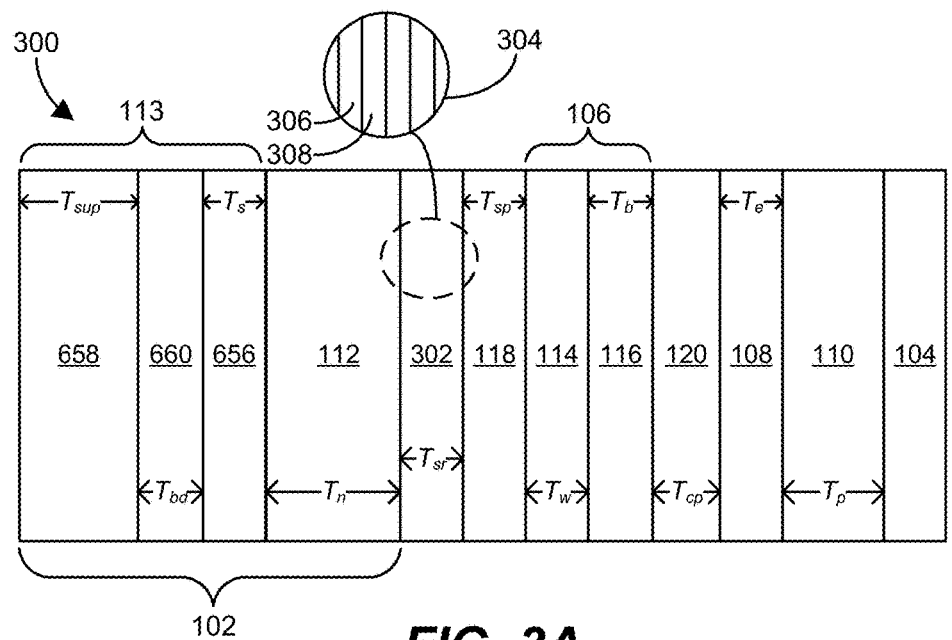
FIG. 3A is a simplified side view of another semiconductor structure similar to the semiconductor structure of FIG. 1A, but further including a strain relief layer between an active region and a base layer of the semiconductor structure.
Figure 3B:
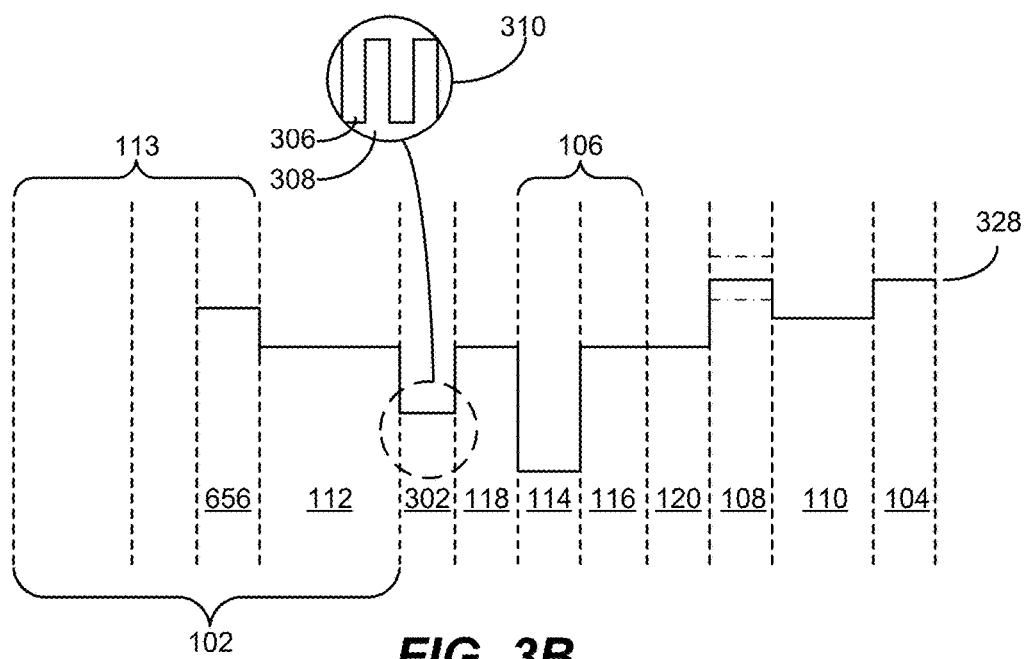
FIG. 3B is a simplified conduction band diagram for the semiconductor structure of FIG. 3A.

As a non-limiting example, FIGS. 3A and 3B illustrate an embodiment of a semiconductor structure 300 that includes such a strain relief layer 302. The semiconductor structure 300 is similar to semiconductor structure 100 and includes an active region 106 comprising one or more InGaN well layers 114 and one or more InGaN barrier layers 116 as previously described in relation to the semiconductor structure 100. The semiconductor structure 300 also includes a base layer 102, a spacer layer 118, a cap layer 120, an electron blocking layer 108, a p-type bulk layer 110 and a p-type contact layer 104 as previously described in relation to the semiconductor structure 100. The strain relief layer 302 of the semiconductor structure 300 is disposed between the base layer 102 and the spacer layer 118. In the embodiment of FIGS. 3A and 3B, the strain relief layer 302 is disposed directly between the $In_nGa_{1-n}N$ base layer 112 and the $In_{sp}Ga_{1-sp}N$ spacer layer 118.

The strain relief layer 302 may comprise a Group III nitride. As a non-limiting example, the strain relief layer 302 may have a superlattice structure, as illustrated in inset 304, comprising alternating layers of $In_{sra}Ga_{1-sra}N$ 306, wherein $0.01 \leq sra \leq 0.10$, and layers of $In_{srb}Ga_{1-srb}N$ 308, wherein $0.01 \leq srb \leq 0.10$. Further, sra may be greater than srb. The semiconductor structure 300 may include any number (e.g., from about one (1) to about twenty (20)) of alternating layers of $In_{sra}Ga_{1-sra}N$ layers 306 and $In_{srb}Ga_{1-srb}N$ 308. The layers 306 and 308 in such a superlattice structure may have an average layer thickness of from about one nanometer (1 nm) to about twenty nanometers (20 nm).

The strain relief layer 302 may be doped n-type with one or more dopants selected from the Group consisting of silicon and germanium. A concentration of the one or more dopants within the strain relief layer 302 may be in a range extending from about $0.1e^{18}$ cm$^{-3}$ to $20e^{18}$ cm$^{-3}$. In some embodiments, the strain relief layer 302 may have an average layer thickness in a range extending from about one nanometer (1 nm) to about fifty nanometers (50 nm).

FIG. 3B is a simplified conduction band diagram and illustrates the relative energy levels of the conduction band 328 for the various materials in the semiconductor structure 300. As shown in FIG. 3B, in the embodiment of the semiconductor structure 300 of FIG. 3A, the energy level of the conduction band 328 within at least a portion of the strain relief layer 302 of the semiconductor structure 300 (FIG. 3A) may be relatively lower than the energy level of the conduction band 328 within the $In_nGa_{1-n}N$ base layer 112 and/or the energy level of the conduction band 328 within the spacer layer 118. In other embodiments, the energy level of the conduction band 328 within at least a portion of the strain relief layer 302 of the semiconductor structure 300 (FIG. 3A) may be relatively higher than the energy level of the conduction band 328 within the InGaN base layer 112 and/or the energy level of the conduction band 328 within the spacer layer 118. In embodiments in which the strain relief layer 302 comprises a superlattice structure, as illustrate in inset 310 of FIG. 3B, comprising alternating layers $In_{sra}Ga_{1-sra}N$ layers 306 and $In_{srb}Ga_{1-srb}N$ 308, the conduction band energy level may vary in periodic manner.

Figure 4A:
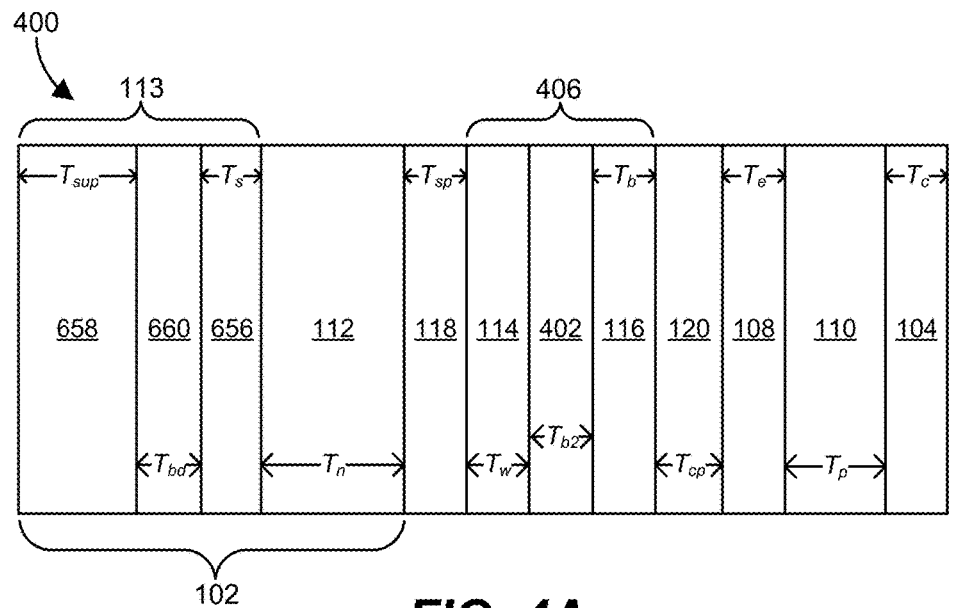
FIG. 4A is a simplified side view of another semiconductor structure similar to the semiconductor structure of FIG. 1A, but further including additional thin GaN barrier layers within the active region of the semiconductor structure.
Figure 4B:
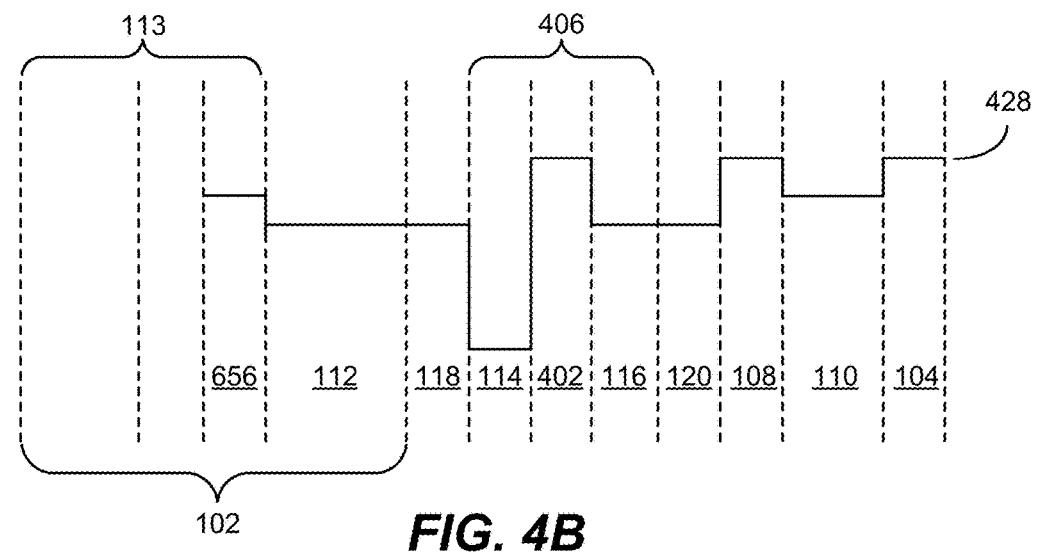
FIG. 4B is a simplified conduction band diagram for the semiconductor structure of FIG. 4A.

FIGS. 4A and 4B illustrate yet another embodiment of a semiconductor structure 400 of the present disclosure. The semiconductor structure 400 is similar to the semiconductor structure 100 and includes an active region 406 comprising one or more InGaN well layers 114 and one or more InGaN barrier layers 116 as previously described in relation to the semiconductor structure 100. The semiconductor structure 400 also includes a base layer 102, a spacer layer 118, a cap layer 120, an electron blocking layer 108, a p-type bulk layer 110 and a p-type contact layer 104 as previously described in relation to the semiconductor structure 100. The active region 406 of the semiconductor structure 400 further includes additional GaN barrier layers 402. Each of the additional GaN barrier layers 402 may be disposed between an InGaN well layer 114 and an InGaN barrier layer 116. The additional GaN barrier layers 402 may serve to further confine electrons within the well layers 114, where they may be more likely to recombine with holes and result in an increased probability of emission of radiation.

In some embodiments, each GaN barrier layer 402 may be doped n-type with one or more dopants selected from the Group consisting of silicon and germanium. For example, a concentration of the one or more dopants within the GaN barrier layers 402 may be in a range extending from about $1.0e^{17}$ cm$^{-3}$ to $50e^{17}$ cm$^{-3}$. In some embodiments, each GaN barrier layer 402 may have an average layer thickness $T_{b2}$ in a range extending from about one-half of a nanometer (0.5 nm) to about twenty nanometers (20 nm).

FIG. 4B is a simplified conduction band diagram and illustrates the relative energy levels of the conduction band 428 for the various materials in the semiconductor structure 400. As shown in FIG. 4B, in the embodiment of the semiconductor structure 400 of FIG. 4A, the energy level of the conduction band 428 within the GaN barrier layers 402 (FIG. 4A) may be relatively higher than the energy level of the conduction band 428 within the InGaN barrier layers 116 and higher than the energy level of the conduction band 428 within the InGaN well layers 114.

Figure 5A:
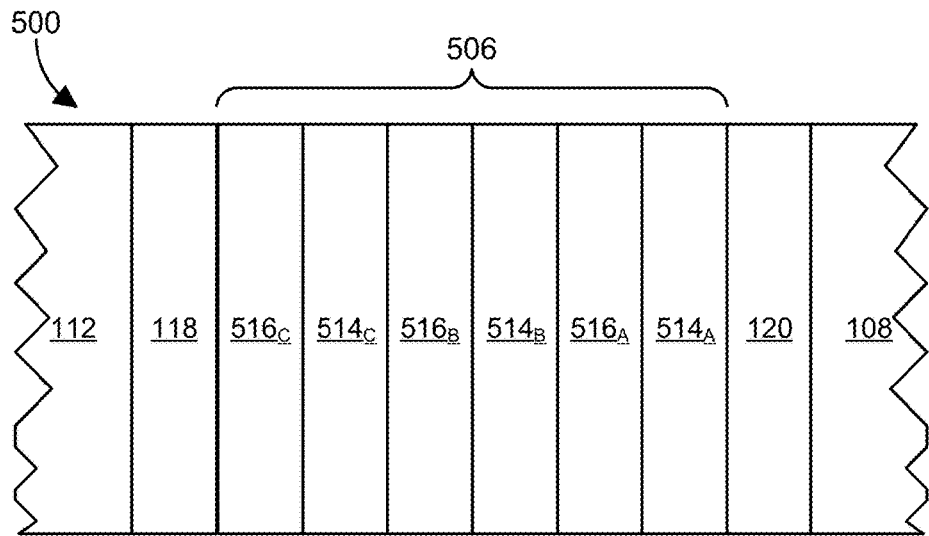
FIG. 5A is a simplified side view of another semiconductor structure similar to the semiconductor structure of FIG. 1A, but further including a well overflow structure within the active region of the semiconductor structure.
Figure 5B:
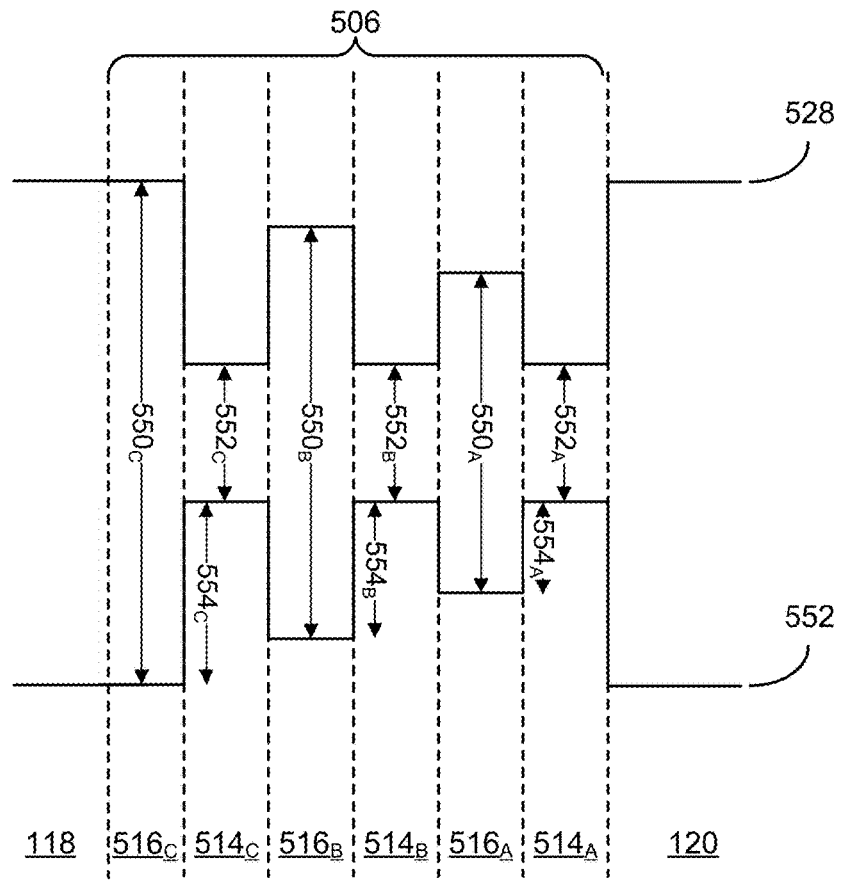
FIG. 5B is a simplified band diagram for the semiconductor structure of FIG. 5A.

FIGS. 5A and 5B illustrate yet further embodiments of the present disclosure comprising a semiconductor structure 500. In these embodiments, methods as disclosed in U.S. patent application Ser. No. 13/362,866, which was filed Jan. 31, 2012 in the name of Arena et al., may be utilized for forming an active region 506. The semiconductor structure 500 is similar to the semiconductor structure 100 and includes an active region 506 comprising one or more InGaN well layers 514 and one or more InGaN barrier layers 516 as previously described in relation to the semiconductor structure 100. The semiconductor structure 500 also includes a base layer 102, a spacer layer 118, a cap layer 120, an electron blocking layer 108, a p-type bulk layer 110 and a p-type contact layer 104 as previously described in relation to the semiconductor structure 100. For clarity, only the layers surrounding the active region 506 are illustrated, and these layers may comprise the optional spacer layer 118 and cap layer 120 as well as the $In_nGa_{1-n}N$ base layer 112 and the electron blocking layer 108. If the optional layers are omitted from the semiconductor structure 500, the active region 506 may be disposed directly between the base layer 102 and the electron blocking layer 108.

The active region 506 of the semiconductor structure 500 is similar to the active region 106 of the semiconductor structure 100, but further includes two or more InGaN barrier layers wherein the band-gap energy between subsequent barrier layers increases in a step-wise manner from right to left as viewed in FIG. 5A and FIG. 5B, i.e., in the direction extending from the cap layer 120 to the spacer layer 118. Such a configuration of the active region 506 in the semiconductor structure 500 may assist in confinement of charge carriers within the active region 506 by preventing overflow of carriers out from the active region 506, thereby increasing the efficiency of light-emitting devices fabricated from the semiconductor structure 500.

The barrier regions $516_A$-$516_C$ may have a material composition and structural configuration selected to provide each of the barrier regions $516_A$-$516_C$ with respective band-gap energies $550_A$-$550_C$, where the band-gap energy is given by the energy difference between the conduction band energy 528 and the valence band energy 552 of each of the semiconductor materials comprising the semiconductor structure 500. The band-gap energy $550_A$ in the first barrier region $516_A$ may be less than the band-gap energy $550_B$ in the second barrier region $516_B$, and the band-gap energy 550 in the second barrier region $516_B$ may be less than the band-gap energy $550_C$ in the third barrier region $516_C$, as shown in the energy band diagram of FIG. 5B. Further, each of the band-gap energies $552_A$-$552_C$ of the quantum well regions $514_A$-$514_C$ may be substantially equal and may be less than each of the band-gap energies $550_A$-$550_C$ of the barrier regions $516_A$-$516_C$.

In this configuration, a hole energy barrier $554_A$ between the first quantum well $514_A$ and the second quantum well $514_B$ may be less than an hole energy barrier $554_B$ between the second quantum well $514_B$ and the third quantum well $514_C$. In other words, the hole energy barriers $554_A$-$554_C$ across the barrier regions $516_A$-$516_C$ may increase in a step-wise manner across the active region 506 in the direction extending from the cap layer 120 to the spacer layer 118. The electron hole energy barriers $554_A$-$554_C$ are the differences in the energies of the valence band 552 across the interfaces between the quantum well regions $514_A$-$514_C$ and the adjacent barrier regions $516_A$-$516_C$. As a result of the increasing electron hole energy barriers $554_A$-$554_C$ across the barrier regions $516_A$-$516_C$ moving from the cap layer 120 toward the spacer layer 118, an increase in the uniformity of distribution of holes may be achieved within the active region 506, which may result in improved efficiency during operation of a light-emitting device fabrication from semiconductor 500.

As previously mentioned, the barrier regions $516_A$-$516_C$ may have a material composition and structural configuration selected to provide each of the barrier regions $516_A$-$516_C$ with their different, respective band-gap energies $550_A$-$550_C$. By way of example and not limitation, each barrier region $516_A$-$516_C$ may comprise a ternary III-nitride material, such as $In_{b3}Ga_{1-b3}N$, wherein b3 is at least about 0.01. Decreasing the indium content (i.e., decreasing the value of b3) in the $In_{b3}Ga_{1-b3}N$ of the barrier regions $516_A$-$516_C$ may increase the band-gap energy of the barrier regions $516_A$-$516_C$. Thus, the second barrier region $516_B$ may have a lower indium content relative to the first barrier region $516_A$, and the third barrier region $516_C$ may have a lower indium content relative to the second barrier region $516_B$. In addition, the barrier regions $516_A$-$516_C$ and well regions $514_A$-$514_C$ may be doped and may have an average layer thickness as previously described with respect to semiconductor structure 100.

As previously mentioned, in accordance with embodiments of the present disclosure, the active region 106 (of FIG. 1A) may comprise at least one InGaN well layer and at least one InGaN barrier layer, and, in some embodiments, may be at least substantially comprised of InGaN (e.g., may consist essentially of InGaN, but for the presence of dopants). A majority of previously known light-emitting device structures that comprise InGaN well layers include GaN (at least substantially free of indium) barrier layers. The difference in the energy level of the conduction band between InGaN well layers and GaN barrier layers is relatively high, which, according to teachings in the art, provides improved confinement of charge carriers within the well layers and may result in improved efficiency of the LED structures. However, the prior art structures and methods may result in a decrease in device efficiency due to carrier overflow and piezoelectric polarization.

In carrier overflow theory, the one or more quantum well layers may be analogous to a water bucket, with their capability to capture and hold injected carriers diminishing at higher injection of carriers. When injected carriers are not captured or held, they overflow the active region and are wasted, contributing to a drop in device efficiency. In prior art structures comprising InGaN quantum wells and GaN barrier layers, the band off-set, i.e., the difference in conduction band energy levels between the quantum wells and barriers is significantly greater than the band off-set for an active region substantially comprised of InGaN, as described in the embodiments herein. The reduction in the band off-set in the structures described herein allows the injected carriers to more efficiently distribute across the quantum well layers of the active region, thereby increasing the efficiency of light-emitting devices fabricated from the semiconductor structures described herein.

In addition, due to lattice mismatch between the InGaN well layers and the GaN barrier layers, a relatively strong piezoelectric polarization occurs within the active region in such light-emitting device structures. The piezoelectric polarization may decrease the overlap between the wave functions for the electrons and the wave functions for the holes within the active regions of the light-emitting device structures. As disclosed in, for example, J. H. Son and J. L. Lee, "Numerical Analysis of Efficiency Droop Induced by Piezoelectric Polarization in InGaN/GaN Light-Emitting Diodes," *Appl. Phys. Lett.* 97, 032109 (2010), the piezoelectric polarization may result in what is referred to as "efficiency droop" in such light-emitting device structure (e.g., LEDs). The efficiency droop phenomena is a droop (a decrease) in a graph of the internal quantum efficiency (IQE) of the LED structure with increasing current density.

Embodiments of the light-emitting structure, such as LED structures of the present disclosure may alleviate or overcome problems of previously known LED structures that have InGaN well layers and GaN barrier layers associated with lattice mismatch, the carrier overflow, the piezoelectric polarization phenomena, and efficiency droop. Embodiments of LEDs of the present disclosure, such as the LED structure fabricated from semiconductor structure 100 of FIGS. 1A and 1B, may be configured, and the energy band structure thereof designed, such that the active region 106 exhibits a reduced piezoelectric polarization effect, and increased overlap of the wave function of the electrons and the wave function of the holes. As a result, the light-emitting device, such as LEDs may exhibit improved uniformity of charge carriers across the active region 106, and reduced efficiency droop with increasing current density.

Figure 10A:
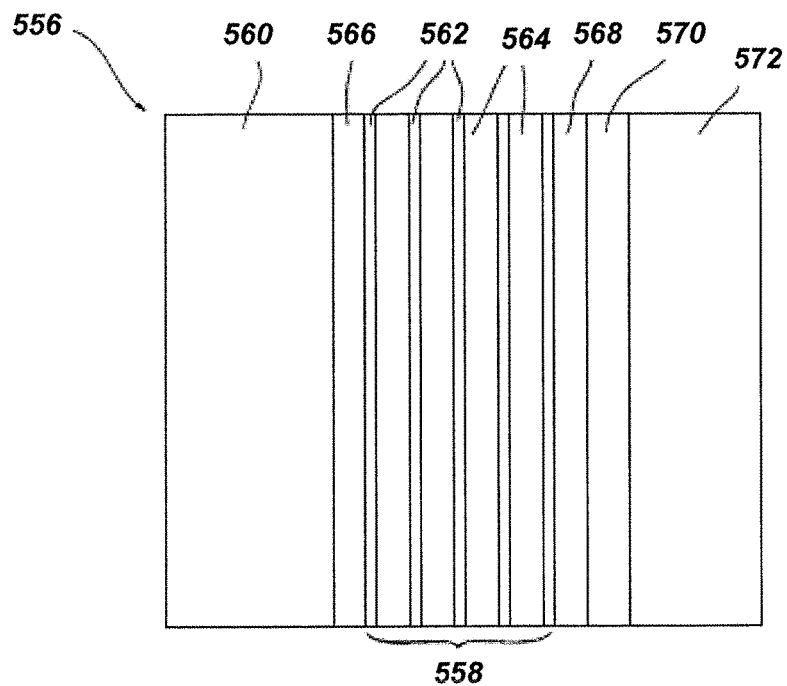
FIG. 10A is a simplified side view of a previously known LED that includes InGaN well layers and GaN barrier layers in an active region of the LED.
Figure 10B:
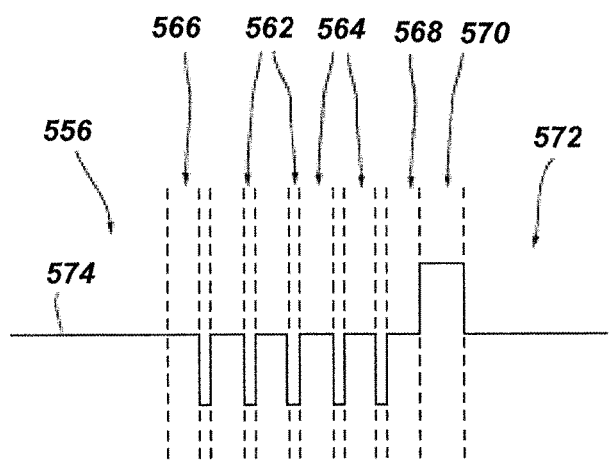
FIG. 10B is a simplified conduction band diagram for the LED of FIG. 10A.

These advantages that may be attained through embodiments of the present disclosure are further discussed below with reference to FIGS. 10A and 10B, 11A-11E, 12A and 12B, and 13A-13E. FIGS. 10A and 10B illustrate an embodiment of an LED 556 similar to previously known LEDs. The LED 556 includes an active region 558 comprising five (5) InGaN well layers 562 with GaN barrier layers 564 disposed between the InGaN well layers 562. The LED 556 also includes a base layer 560, a first spacer layer 566, a second spacer layer 568, an electron blocking layer 570, and an electrode layer 572. In the LED 556, the InGaN well layers 562 comprise layers of $In_{0.18}Ga_{0.82}N$, each having an average layer thickness of about two and one-half nanometers (2.5 nm). The barrier layers 564 comprise layers of GaN, which may have an average layer thickness of about ten nanometers (10 nm). The base layer 560 comprises a layer of doped GaN having an average layer thickness of about three hundred twenty-five nanometers (325 nm), which is doped n-type with silicon at a concentration of about $5e^{18}$ cm$^{-3}$. The first spacer layer 566 may comprise undoped GaN having an average layer thickness of about twenty-five nanometers (25 nm). The second spacer layer 568 also may comprise undoped GaN having an average layer thickness of about twenty-five nanometers (25 nm). The electron blocking layer 570 may comprise p-doped AlGaN. The electrode layer 572 may comprise a layer of doped GaN, such electrode layer may have an average layer thickness of about one hundred twenty-five nanometers (125 nm), which is doped p-type with magnesium at a concentration of about $5e^{17}$ cm$^{-3}$. FIG. 10B is a simplified conduction band diagram similar to that of FIG. 1B, and illustrates the relative differences in the energy level of the conduction band 574 (in an energy band diagram) for the different materials in the various layers of the LED 556 of FIG. 10A. The vertical dashed lines in FIG. 10B are aligned with the interfaces between the various layers in the LED 556 of FIG. 10A.

As known in the art, the 8×8 Kane Model disclosed in, for example, S. L. Chuang and C. S. Chang, "k·p Method for Strained Wurtzite Semiconductors," *Phys. Rev. B* 54, 2491 (1996), may be used to characterize the structure of the valence band for Group-III nitride materials such as GaN and InGaN. The splitting of the heavy, light, and split-off branches of the valence bands in the center of the Brillouin zone may be assumed to be independent of the built-in electric field. Therefore, the valence subbands may be obtained from the solution of coupled Poisson and transport equations. The wave functions of electrons and holes may be assumed to be in the form:

$$u_n \Psi_v \cdot \exp(k_n \cdot r), \text{ and}$$

$$u_{p,s} \Psi_{v,s} \cdot \exp(k_p \cdot r),$$

respectively, wherein $u_n$ and $u_{p,s}$ are the Bloch amplitudes of electrons and holes corresponding to the center of the Brillouin zone, $k_n$ and $k_p$ are in-plane quasi-moment vectors, $\Psi_v$ and $\Psi_{v,s}$ are the envelope functions, and the subscript "s" can be heavy (hh), light (lh), or split-off (so) holes. The one-dimensional Schrödinger equations for electron and hole envelope functions are:

$$-\frac{\hbar^2}{2m_n^{||}} \frac{d^2 \Psi_v}{dz^2} + U_C^{eff} \Psi_v = E_v \Psi_v, \text{ and}$$

$$-\frac{\hbar^2}{2m_p^{||}} \frac{d^2 \Psi_{v,s}}{dz^2} + U_{V,s}^{eff} \Psi_{v,s} = E_{v,s} \Psi_{v,s},$$

respectively, wherein $U_C^{eff}$ and $U_{V,s}^{eff}$ are the effective potential for electrons and holes in the quantum well, $E_v$ and $E_{v,s}$ are electron and hole energy levels, and $m_n^{||}$ and $m_p^{||}$ are electron and hole effective mass in the epitaxial growth direction. By solving the above Schrödinger equations with corresponding boundary conditions, the overlap integral between the electron and hole wave functions is then obtained from:

$$\langle \Psi_i^e | \psi_j^h \rangle = \int_{-\infty}^{\infty} \Psi_i^e(z) \Psi_i^h(z) dz.$$

As disclosed in S. L. Chuang, *Physics of Phonic Devices*, 2$^{nd}$ Ed. (Wiley, N.J., 2009), the rate of radiative recombination of electrons and holes may be given by:

$$R^{rad} = B \cdot np \cdot \left[ 1 - \exp\left(-\frac{F_n - F_p}{kT}\right) \right],$$

where B is the radiative recombination coefficient, n is the electron concentration, p is the hole concentration, and $F_n-F_p$ is the quasi-Fermi level separation. Electron and hole concentration and quasi-Fermi level separation varies with position across the active region of an LED. The maximum radiative recombination rate may be identified in any quantum well and considered as the peak radiative recombination rate for that respective quantum well.

Figure 11A:
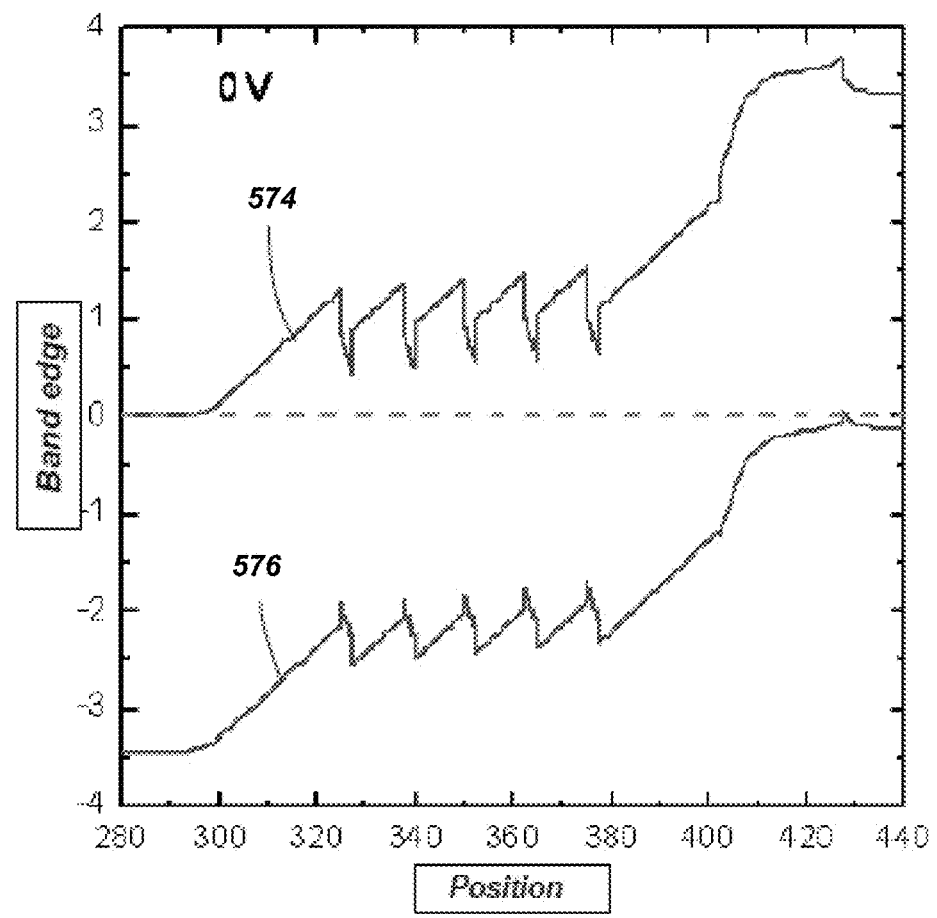
FIG. 11A is a graph illustrating calculated band edges for the conduction band and the valence band with zero applied voltage across the active region of the LED of FIG. 10A, the calculations obtained using a computational model of the LED.
Figure 11B:
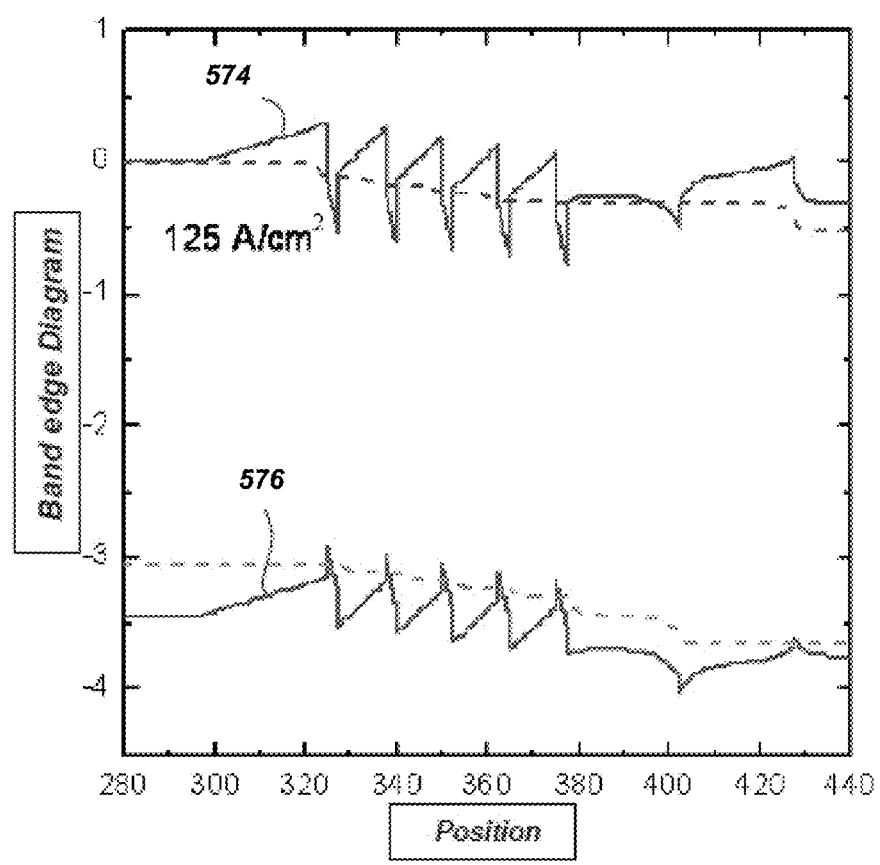
FIG. 11B is a graph similar to that of FIG. 11A, but illustrating the calculated band edges for the conduction band and the valence band with a current density of 125 $A/cm^2$ flowing across the active region of the LED due to an applied voltage across the active region.

FIG. 11A is a graph illustrating the calculated energy of the band edge of the conduction band 574 and the valence band 576 for the LED 556 of FIGS. 10A and 10B, with zero applied current across the LED 556, as a function of position (in nanometers) across the LED 556 beginning at the surface of the base layer 560 opposite the active region 558. FIG. 11B is a graph similar to that of FIG. 11A, but illustrating the calculated energy of the band edge of the conduction band 574 and the valence band 576 for the LED 556 of FIGS. 10A and 10B at an applied current density across the LED 556 of one hundred twenty-five amps per square centimeter (125 A/cm$^2$).

Figure 11C:
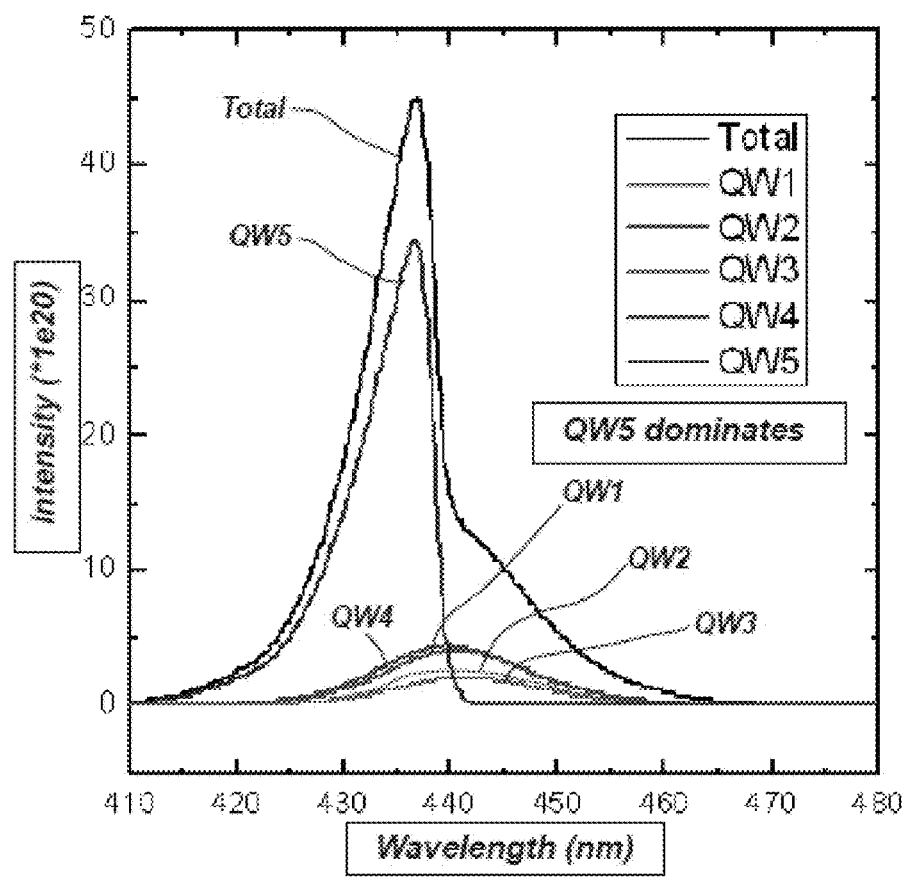
FIG. 11C is a graph illustrating the calculated intensity of emitted radiation as a function of wavelength for each InGaN quantum well layer in the LED of FIG. 11A.
Figure 11D:
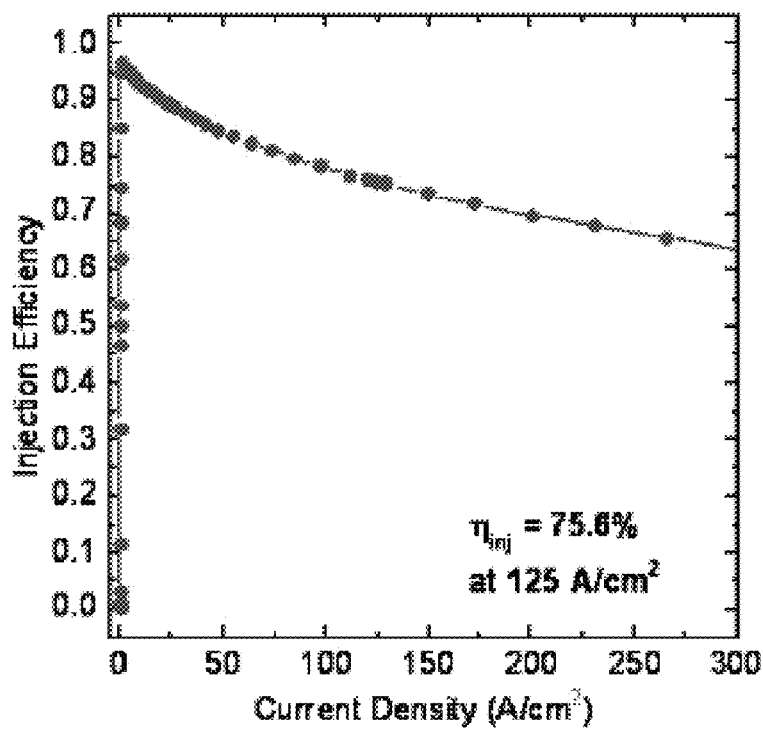
FIG. 11D is a graph illustrating the calculated carrier injection efficiency as a function of applied current density across the active region of the LED of FIG. 11A.
Figure 11E:
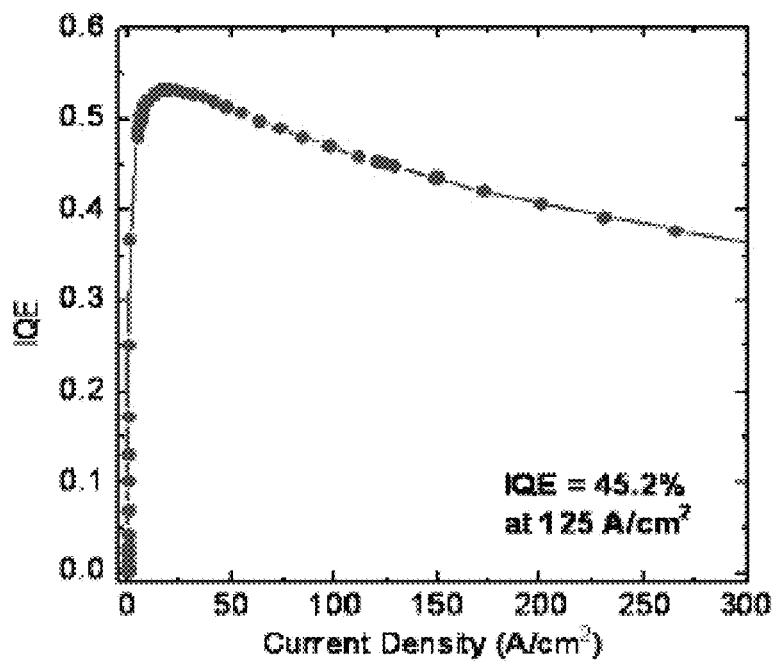
FIG. 11E is a graph illustrating the calculated internal quantum efficiency as a function of applied current density across the active region of the LED of FIG. 11A.

FIG. 11C is a graph that illustrates the calculated intensity as a function of wavelength for each of the five quantum well layers 562 of the LED 556 with the applied current density across the LED 556 of one hundred twenty-five amps per square centimeter (125 A/cm$^2$). QW1 is the leftmost quantum well layer 562, and QW5 is the rightmost quantum well layer 562 from the perspective of FIGS. 10A and 10B. FIG. 11D illustrates the calculated injection efficiency of the LED 556 as a function of applied current density. As shown in FIG. 11D, the LED 556 may exhibit an injection efficiency of about 75.6% at an applied current density of 125 A/cm$^2$. FIG. 11E illustrates the calculated internal quantum efficiency (IQE) of the LED 556 as a function of applied current density. As shown in FIG. 11E, the LED 556 may exhibit an internal quantum efficiency of about 45.2% at an applied current density of 125 A/cm$^2$. As also shown in FIG. 11E, the internal quantum efficiency of the LED 556 may drop from over 50% at an applied current density of about 20 A/cm$^2$ to under 40% at an applied current density of 250 A/cm$^2$. As previously discussed, such a drop in the IQE is referred to in the art as efficiency droop.

Table 1 below shows the calculated Wave Function Overlap and Peak Radiative Recombination Rate for each of the five quantum well layers 562 in the LED 556 of FIGS. 10A and 10B.

TABLE 1

|  | QW1 | QW2 | QW3 | QW4 | QW5 |
| --- | --- | --- | --- | --- | --- |
| Wave Function Overlap | 0.328 | 0.326 | 0.325 | 0.341 | 0.362 |
| Peak Radiative Recombination Rate | $6.5e^{26}$ | $3.3e^{26}$ | $3.3e^{26}$ | $6.8e^{26}$ | $2.4e^{27}$ |

As can be seen from FIG. 11C and Table 1 above, radiative recombinations come principally from the last well layer 562 (closest to the p-doped side, or anode), which is quantum well number five (i.e., QW5) in the LED 556. Further, as shown in FIG. 11E, the LED 556 exhibits efficiency droop, which may result at least in part due to the piezoelectric polarization caused by the use of InGaN well layers 562 and GaN barrier layers 564 as previously discussed herein.

Embodiments of LEDs of the present disclosure that include an active region including at least one InGaN well layer and at least one InGaN barrier layer, such as the active region 106 of the LED 100, may exhibit improved uniformity in the radiative recombinations occurring in the well layers, and may exhibit reduced efficiency droop. A comparison of an embodiment of an LED of the present disclosure with the LED 556 is provided with reference to FIGS. 12A and 12B, and 13A through 13E below.

Figure 12A:
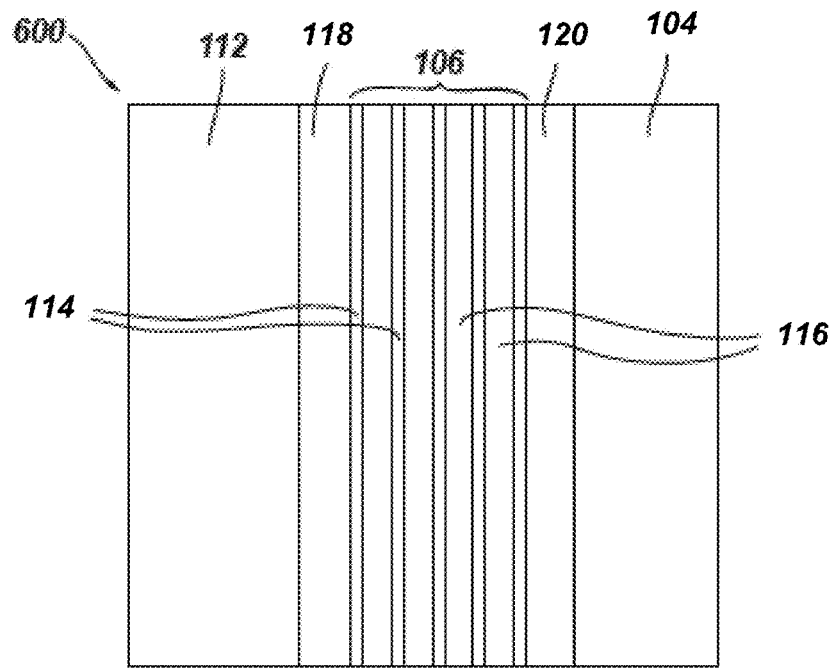
FIG. 12A is a simplified side view of an LED of the present disclosure, which is similar to that of FIG. 1A and includes InGaN well layers and InGaN barrier layers in an active region of the LED.
Figure 12B:
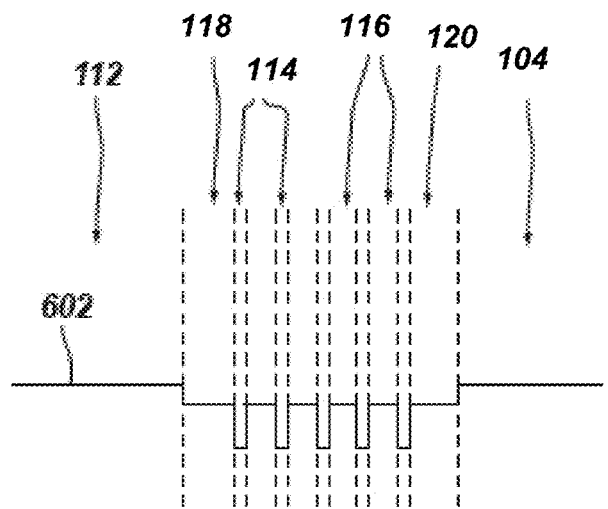
FIG. 12B is a simplified conduction band diagram for the LED of FIG. 12A.

FIGS. 12A and 12B illustrate another example of an embodiment of an LED 600 of the present disclosure. The LED 600 includes an active region 106 comprising five (5) InGaN well layers 114 with InGaN barrier layers 116 disposed between the InGaN well layers 114. The InGaN well layers 114 and the InGaN barrier layers 116 may be as previously described in relation to the semiconductor structure 100 with reference to FIGS. 1A and 1B. The LED 600 also includes a base layer 112, a first spacer layer 118, a cap layer 120, and an InGaN electrode layer 104. In the LED 600, the InGaN well layers 114 comprise layers of In$_{0.18}$Ga$_{0.82}$N, each having an average layer thickness of about two and one-half nanometers (2.5 nm). The barrier layers 116 comprise layers of In$_{0.08}$Ga$_{0.92}$N, and each may have an average layer thickness of about ten nanometers (10 nm). The base layer 112 comprises a layer of doped In$_{0.08}$Ga$_{0.95}$N having an average layer thickness of about three hundred nanometers (300 nm), which is doped n-type with silicon at a concentration of about $5e^{18}$ cm$^{-3}$. The first spacer layer 118 may comprise undoped In$_{0.08}$Ga$_{0.92}$N having an average layer thickness of about twenty-five nanometers (25 nm). The cap layer 120 also may comprise undoped In$_{0.08}$Ga$_{0.92}$N having an average layer thickness of about twenty-five nanometers (25 nm). The electrode layer 104 may comprise a layer of doped In$_{0.08}$Ga$_{0.95}$N, that may have an average layer thickness of about one hundred fifty nanometers (150 nm), which is doped p-type with magnesium at a concentration of about $5e^{17}$ cm$^{-3}$. FIG. 12B is a simplified conduction band diagram illustrating the relative differences in the energy level of the conduction band 602 (in an energy band diagram) for the different materials in the various layers of the LED 600 of FIG. 12A.

Figure 13A:
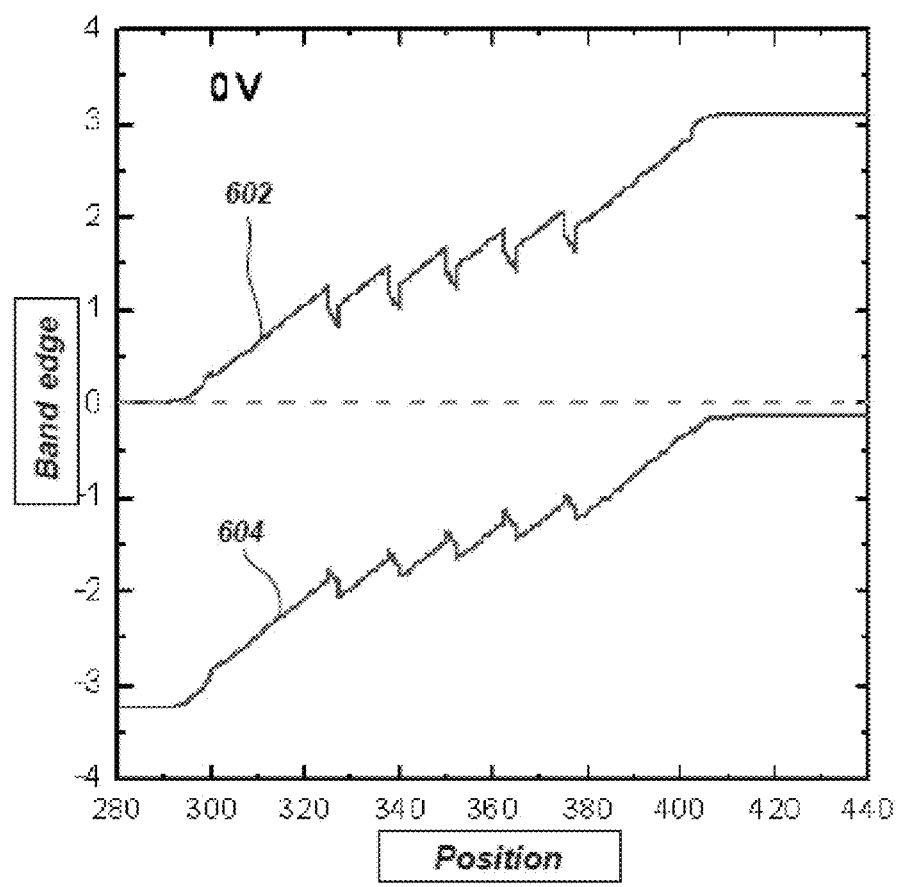
FIG. 13A is a graph illustrating calculated band edges for the conduction band and the valence band with zero applied voltage across the active region of the LED of FIG. 12A, the calculations obtained using a computational model of the LED.
Figure 13B:
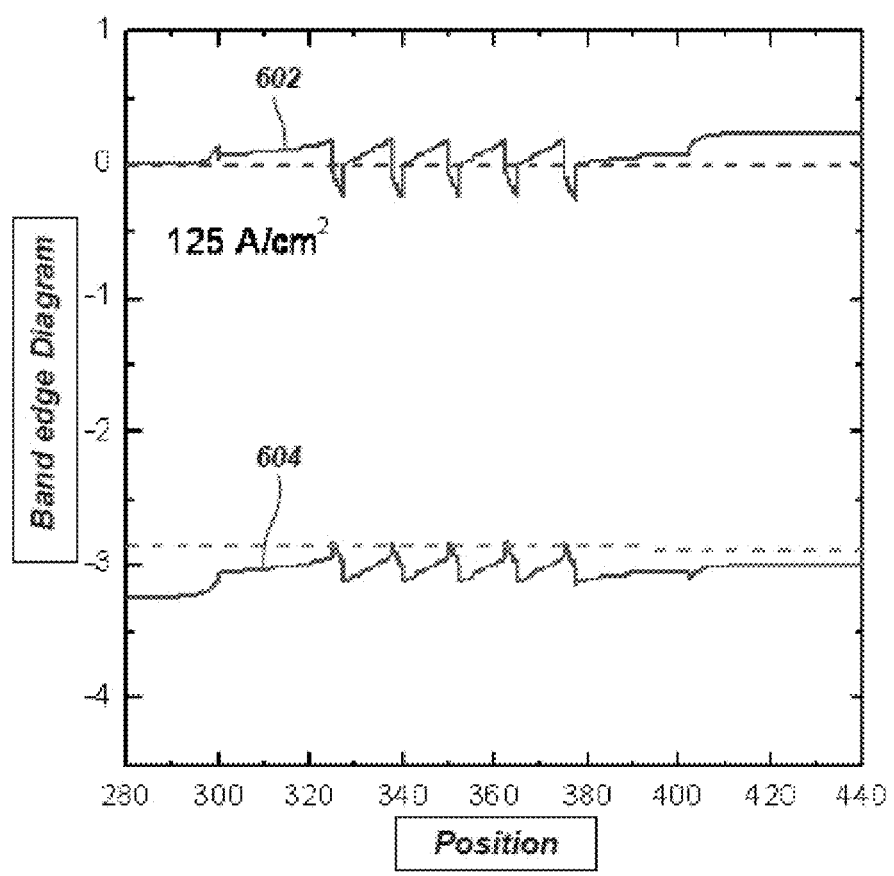
FIG. 13B is a graph similar to that of FIG. 13A, but illustrating the calculated band edges for the conduction band and the valence band with a current density of 125 $A/cm^2$ flowing across the active region of the LED due to an applied voltage across the active region.
Figure 13C:
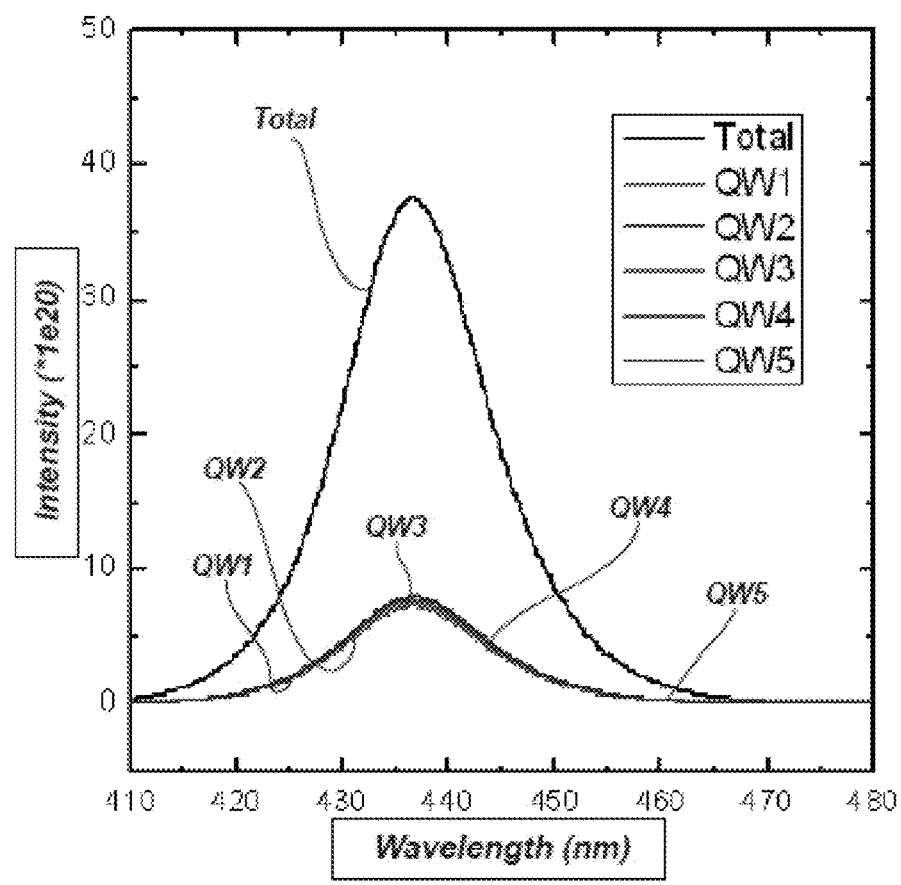
FIG. 13C is a graph illustrating the calculated intensity of emitted radiation as a function of wavelength for each InGaN quantum well layer in the LED of FIG. 13A.
Figure 13D:
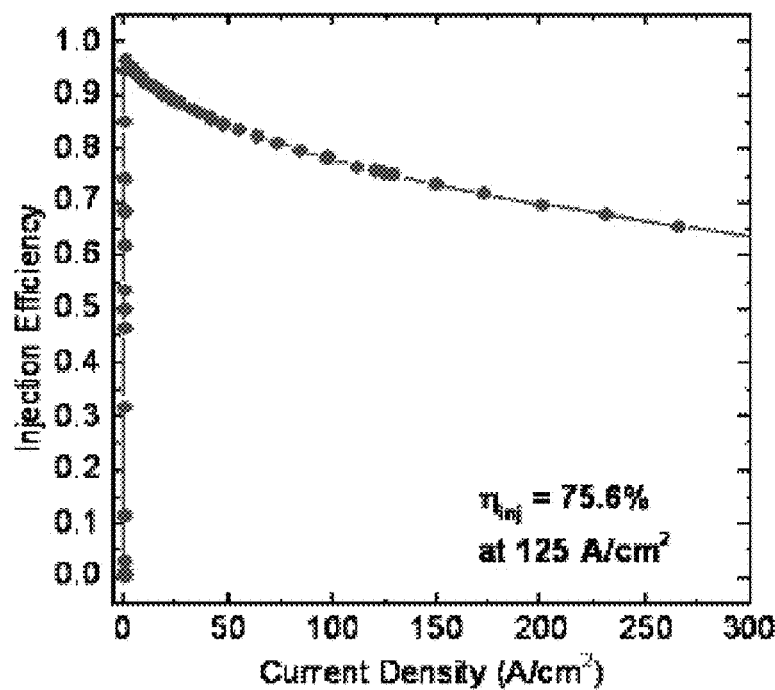
FIG. 13D is a graph illustrating the calculated carrier injection efficiency as a function of applied current density across the active region of the LED of FIG. 13A.
Figure 13E:
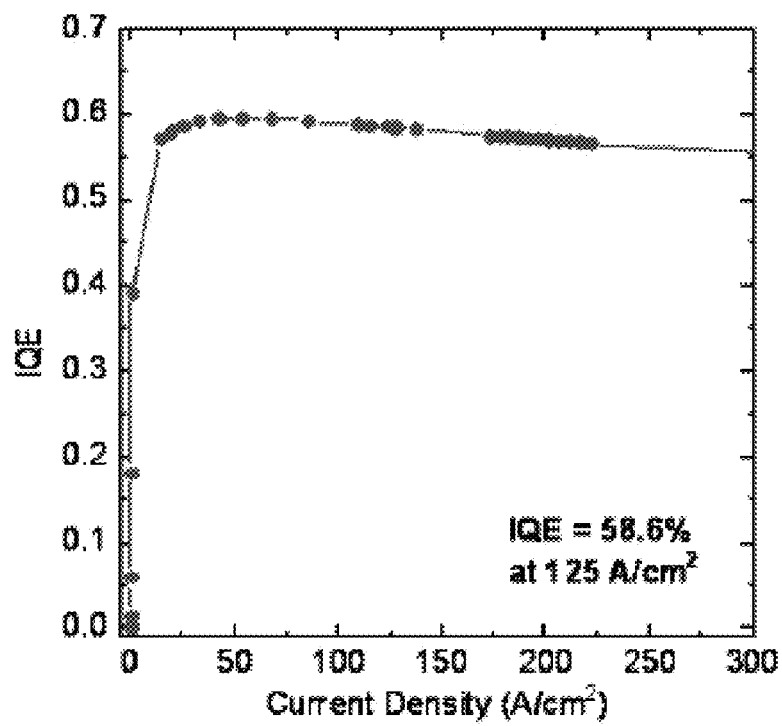
FIG. 13E is a graph illustrating the calculated internal quantum efficiency as a function of applied current density across the active region of the LED of FIG. 13A.

FIG. 13A is a graph illustrating the calculated energy of the band edge of the conduction band 602 and the valence band 604 for the LED 600 of FIGS. 12A and 12B, with zero applied current across the LED 600, as a function of position (in nanometers) across the LED 600 beginning at the surface of the base layer 112 opposite the active region 106. FIG. 13B is a graph similar to that of FIG. 13A, but illustrating the calculated energy of the band edge of the conduction band 602 and the valence band 604 for the LED 600 of FIGS. 12A and 12B at an applied current density across the LED 600 of one hundred twenty-five amps per square centimeter (125 A/cm$^2$). FIG. 13C is a graph that illustrates the calculated intensity as a function of wavelength for each of the five quantum well layers 114 of the LED 600 with the applied current density across the LED 600 of one hundred twenty-five amps per square centimeter (125 A/cm$^2$). QW1 is the leftmost quantum well layer 114, and QW5 is the rightmost quantum well layer 114 from the perspective of FIGS. 12A and 12B. FIG. 13D illustrates the calculated injection efficiency of the LED 600 as a function of applied current density. As shown in FIG. 13D, the LED 600 may exhibit an injection efficiency of about 87.8% at an applied current density of 125 A/cm$^2$, and may exhibit a carrier injection efficiency of at least about 80% over a range of current densities extending from about 20 A/cm$^2$ to about 250 A/cm$^2$. FIG. 13E illustrates the calculated internal quantum efficiency (IQE) of the LED 600 as a function of applied current density. As shown in FIG. 13E, the LED 600 may exhibit an internal quantum efficiency of about 58.6% at an applied current density of 125 A/cm$^2$. As also shown in FIG. 13E, the internal quantum efficiency of the LED 600 may remain between about 55% and about 60% at an applied current density in the range extending from about 20 A/cm$^2$ to 250 A/cm$^2$. Thus, the LED 600 exhibits very little efficiency droop, and significantly less efficiency droop than the efficiency droop exhibited by the LED 556 (which LED 556 does not conform to embodiments of the present disclosure).

Table 2 below shows the calculated Wave Function Overlap and Peak Radiative Recombination Rate for each of the five quantum well layers 114 in the LED 600 of FIGS. 12A and 12B.

TABLE 2

|  | QW1 | QW2 | QW3 | QW4 | QW5 |
| --- | --- | --- | --- | --- | --- |
| Wave Function Overlap | 0.478 | 0.493 | 0.494 | 0.494 | 0.471 |
| Peak Radiative Recombination Rate | 7.8e$^{26}$ | 7.7e$^{26}$ | 7.9e$^{26}$ | 8.1e$^{26}$ | 8.3e$^{26}$ |

As can be seen from FIG. 13C and Table 2 above, radiative recombinations are more uniform across the well layers 114 in the LED 600 compared to the well layers 562 in the LED 556.

The LED 556 of FIGS. 10A and 10B and the LED 600 of FIGS. 12A and 12B were modeled using S$_I$LENSE® software, which is commercially available from STR Group, Inc. The S$_I$LENSE® software was also used to produce the graphs of FIGS. 11A-11E and 13A-13E, and to obtain the data set forth in Tables 1 and 2.

In accordance with some embodiments of the present disclosure, the LEDs may exhibit an internal quantum efficiency of at least about 45% over a range of current density extending from about 20 A/cm$^2$ to about 250 A/cm$^2$, at least about 50% over a range of current density extending from about 20 A/cm$^2$ to about 250 A/cm$^2$, or even at least about 55% over a range of current density extending from about 20 A/cm$^2$ to about 250 A/cm$^2$. Further, the LEDs may exhibit an at least substantially constant carrier injection efficiency over a range of current density extending from about 20 A/cm$^2$ to about 250 A/cm$^2$. In some embodiments, LEDs of the present disclosure may exhibit a carrier injection efficiency of at least about 80% over a range of current densities extending from about 20 A/cm$^2$ to about 250 A/cm$^2$.

Non-limiting examples of methods that may be utilized to fabricate semiconductor structures and light-emitting devices, such as LEDs, of the embodiments of the disclosure are briefly described below with reference to FIG. 6D and examples of light-emitting devices fabricated by such methods are described with reference to FIG. 7 and FIG. 8.

Figure 6D:
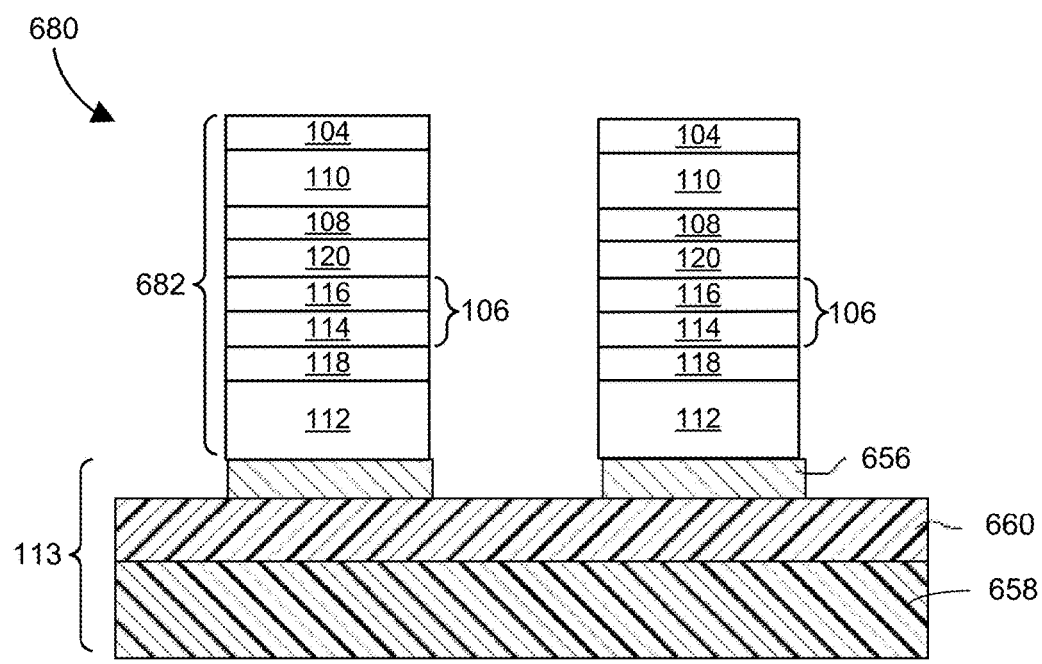
FIG. 6D illustrates layers of a growth stack epitaxially deposited on a growth template.

Referring to FIG. 6D, a growth template 113 including a growth substrate 658, a Group III nitride nucleation layer 660 and a GaN seed layer 656 (fabricated as previously described hereinabove) may be disposed within a deposition chamber, and layers comprising Group III nitride materials, commonly referred to as the growth stack 682 may be epitaxially, sequentially grown on the seed layer 656 of the growth template 113. It should be noted that, although the seed layer 656 is illustrated a continuous film over the growth substrate 658, in some embodiments, i.e., wherein the seed layer 656 comprises a plurality of "island" seed layers, the seed layer 656 may comprise a discontinuous film over the growth substrate 658.

FIG. 6D illustrates semiconductor structure 680, comprising a growth template 113, having various layers of the semiconductor structure 100 of FIGS. 1A and 1B deposited thereon. In particular, an optional In$_n$Ga$_{1-n}$N base layer 112 of a semiconductor structure 100 is epitaxially deposited directly on the GaN seed layer 656, with an InGaN spacer layer 118, an InGaN well layer 114, an InGaN barrier layer 116, an InGaN cap layer 120, an electron blocking layer 108, a p-type bulk layer 110 and a p-type contact layer 104 sequentially, epitaxially deposited over the growth template 113.

The various layers of the semiconductor structure 680 comprising the growth stack 682, may be deposited, for example, using a metalorganic chemical vapor deposition (MOCVD) process and system within a single deposition chamber, i.e., without the need for loading or unloading the growth stack during the deposition process. In embodiments of the present disclosure wherein the growth template comprises a growth substrate, a Group III nitride nucleation layer 660 and GaN seed layer, the entirety of the semiconductor structure 680 may be formed over the growth substrate 658 in a single growth cycle, i.e., without the need for loading and unloading during the deposition process.

The pressure within the deposition chamber may be reduced to between about 50 mTorr and about 500 mTorr. The pressure within the reaction chamber during the deposition process may be increased and/or decreased during the deposition of the growth stack 682, and may be tailored for the specific layer being deposited. As a non-limiting example, the pressure in the reaction chamber during the deposition of the In$_n$Ga$_{1-n}$N base layer 112, the spacer layer 118, the one or more well layers 114, the one or more barrier layers 116, the cap layers 120, and the electron blocking layer 108, may range between about 50 mTorr and about 500 mTorr, and may be equal to about 440 mTorr in some embodiments. The pressure within the reaction chamber for the deposition of the p-type bulk layer 110 and the p-type contact layer 104 may range between about 50 mTorr and about 250 mTorr, and may be equal to about 100 mTorr in some embodiments.

The growth template 113 may be heated to a temperature between about 600° C. and about 1,000° C. within the deposition chamber. Metalorganic precursor gases and other precursor gases (and, optionally, carrier and/or purge gases) then may be caused to flow through the deposition chamber and over the seed layers 656 of the growth template 113. The metalorganic precursor gases may react, decompose, or both react and decompose in a manner that results in the epitaxial deposition of Group II nitride layers, such as InGaN layers, on the growth template 113.

As non-limiting examples, trimethylindium (TMI) may be used as a metalorganic precursor for the indium of the InGaN, triethylgallium (TMG) may be used as a metalorganic precursor for the gallium of the InGaN, triethylaluminum (TMA) may be used as a metalorganic precursor for the AlGaN, and ammonia may be used as a precursor for the nitrogen of the Group III nitride layers. SiH$_4$ may be used as a precursor for introducing silicon into the InGaN when it is desired to dope the Group III nitride n-type, and Cp$_2$Mg (bis(cyclopentadienyl)magnesium) may be used as a precursor for introducing magnesium into the Group III nitride when it is desired to dope the Group III p-type. It may be advantageous to tailor a ratio of the indium precursor (e.g., trimethylindium) to the gallium precursor (e.g., triethylgallium) that will result in indium being incorporated into the InGaN at a concentration that is near a saturation point for indium in the InGaN at the deposition temperature. The percentage of indium incorporated into the InGaN may be controlled as the InGaN is epitaxially grown by controlling the growth temperature. Relatively higher amounts of indium will be incorporated at relatively lower temperatures, and relatively lower amounts of indium will be incorporated at relatively higher temperatures. As non-limiting examples, the InGaN well layers 114 may be deposited at temperatures in a range extending from about 600° C. to about 950° C.

The deposition temperature of the various layers of the growth stack 682 may be increased and/or decreased during the deposition process, and may be tailored for the specific layer being deposited. As a non-limiting example, the deposition temperature during the deposition of the $In_nGa_{1-n}N$ base layer 112, the p-type bulk layer 110 and the p-type contact layer 104 may range between about 600° C. to about 950° C., and may be equal to about 900° C. in some embodiments. The growth rate of the $In_nGa_{1-n}N$ base layer 112, the p-type bulk layer 110, and the p-type contact layer 104, may range between about one nanometer per minute (1 nm/min) and about thirty nanometers per minute (30 nm/min). In some embodiments, the growth rate of the $In_nGa_{1-n}N$ base layer 112, the p-type bulk layer 110, and the p-type contact layer 104, may be equal to about 6 nanometers per minute (6 nm/min).

In additional non-limiting example embodiments, the deposition temperature during the deposition of the spacer layer 118, the one or more well layers 114, the one or more barrier layers 116, the cap layer 120, and the electron blocking layer 108 may range between about 600° C. and about 950° C., and may in some embodiments be equal to about 750° C. The growth rate of the spacer layer 118, the one or more well 114/barrier layers 116, the cap layer 120 and the electron blocking layer 108 may range between about one nanometer per minute (1 nm/min) to about thirty nanometers per minute (30 nm/min), and in some embodiments the growth rate of the spacer layer 118, the one or more well 114/barrier layers 116, the cap layer 120 and the electron blocking layer 108 may be equal to about one nanometer per minute (1 nm/min).

In embodiments comprising deposition of InGaN layers, the flow rate ratio of the precursor gases may be selected to provide InGaN layers of high quality. For example, the methods for forming the InGaN layers of semiconductor structure 100 may comprise selecting the gas ratio to provide one or more InGaN layers with a low defect density, substantially free of stain relaxation and substantially free of surface pits.

In non-limiting examples the flow ratio (%) of trimethylindium (TMI) to triethylgallium (TMG) may defined as:

$$\text{flow ratio (\%)} = \frac{\text{flow rate } (TMI)}{\text{flow rate } (TMI + TEG)} \times 100,$$

and such a flow ratio may be increased and/or decreased during the deposition process and therefore tailored for the specific InGaN layer being deposited. As a non-limiting example, the flow ratio during the deposition of the $In_nGa_{1-n}N$ base layer 112 and the p-type bulk layer 110 may range from between about 50% to about 95%, and may in some embodiments be equal to about 85%. In further embodiments, the flow ratio during the deposition of the spacer layer 118, the one or more barrier layers 116 and the cap layer 120 may range between about 1% to about 50%, and may in some embodiments be equal to about 2%. In yet further embodiments, the flow ratio during the deposition of the one or more quantum well layers 114 may range between about 1% to about 50%, and may in some embodiments be equal to about 30%.

The growth template 113 optionally may be rotated within the deposition chamber during the deposition processes. As a non-limiting example, the growth template 113 may be rotated within the deposition chamber during the deposition processes at a rotational speed of between about 50 revolutions per minute (RPM) and about 1500 revolutions per minute (RPM), and may in some embodiments rotate at a rotational speed of equal to about 450 revolutions per minute (RPM). The rotational speed during the deposition process may be increased and/or decreased during the deposition and therefore tailored for the specific layer being deposited. As a non-limiting example, the rotational speed of the growth template during the deposition of the $In_nGa_{1-n}N$ base layer 112, the spacer layer 118, the one or more well layers 114, the one or more barrier layers 116, the cap layers 120 and the electron blocking layer 108 may range between about 50 revolutions per minute (RPM) and about 1500 revolutions per minute (RPM), and may in some embodiments be rotated at a rotational speed of equal to about 440 revolutions per minute (RPM). The rotational speed of the growth template 113 during the deposition of the p-type bulk layer 110 and the p-type contact layer 104 may range between about 50 revolutions per minute (RPM) and about 1500 revolutions per minute (RPM), and may in some embodiments rotate at a rotational speed of equal to about 1000 revolutions per minute (RPM).

In embodiments of the semiconductor structures of the present disclosure comprising deposition of Group III nitride, and in particular InGaN layers, the strain energy of the one or more InGaN layers comprising the growth stack 682, epitaxially deposited over the growth template 113 may affect the efficiency of the light-emitting devices fabricated from such semiconductor structures. In some embodiments the total strain energy developed within the growth stack 682 may be related to the efficiency, as defined by the internal quantum efficiency (IQE), of the semiconductor structures of the present disclosure.

In greater detail, the strain energy stored within an $n^{th}$ layer of InGaN is proportional to the average total thickness $T_n$ of the $n^{th}$ layer of InGaN, and to the concentration of indium % $In_n$ in the $n^{th}$ layer of InGaN. In addition, the total strain energy stored with the plurality of InGaN layers comprising the growth stack 682 is proportional to the sum of the average total thickness $T_n$ of each of the InGaN layers and to the concentration of indium % $In_n$ in the each of the InGaN layers, therefore the total strain energy within the InGaN layers comprising the growth stack 682 may be estimated using the following relationship:

$$\text{Total strain energy (a.u.)} \propto \Sigma (\% \ In_n \times T_n),$$

wherein the average total thickness $T_n$ of the $n^{th}$ layer is expressed in nanometers (nm) and the concentration of indium in the $n^{th}$ InGaN layer % $In_n$ is expressed as an atomic percentage. For example, if an $n^{th}$ layer of InGaN has an average total thickness $T_n$ of one hundred fifty nanometers (150 nm) and an indium concentration % $In_n$ of 2.0 at %, the strain energy within the $n^{th}$ layer of InGaN may be proportional to about 300 a.u. (300=150(2)).

Figure 9:
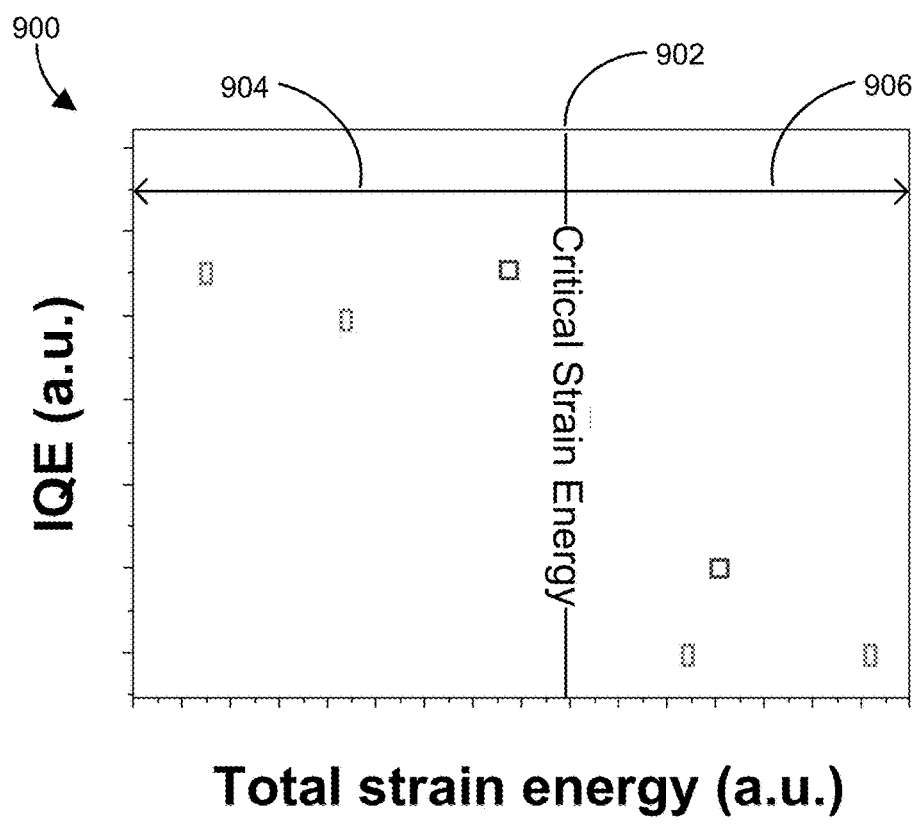
FIG. 9 is a graph illustrating the relationship between internal quantum efficiency and the total strain energy of semiconductors structures formed in accordance with embodiments of methods of the present disclosure.

FIG. 9 illustrates a graph 900 showing the relationship between IQE (a.u.) and total strain energy (a.u.) for the semiconductor structures of the present disclosure. The IQE of the semiconductor structures of the present disclosure may decrease at a value of total strain energy referred to as the "critical strain energy" of the semiconductor structure, as illustrated by line 902 of graph 900. The IQE of the semiconductor structures below the critical strain energy (as represented by line 904) may be substantially greater than the IQE of the semiconductor structures above the critical strain energy (as represented by line 906). For example, graph 900 illustrates IQE values (as shown by rectangular indicators) for several semiconductor structures of the present disclosure. In some embodiments, the IQE below the critical strain energy may be about 500% greater than the IQE above the critical strain energy. In further embodiments, the IQE below the critical strain energy may be about 250% greater than the IQE above the critical strain energy. In yet further embodiments, the IQE below the critical strain energy may be about 100% greater than the IQE above the critical strain energy.

For the semiconductor structures of the present disclosure, the critical strain energy (a.u.) 902 may have a value of about 1800 (a.u.) or less, about 2800 (a.u.) or less, or even about 4500 (a.u.) or less.

In the present disclosure, the plurality of Group III nitride layers comprising the growth stack 682 of FIG. 6D may be deposited in such a manner that the growth stack 682 is substantially fully strained to match the crystal lattice of the GaN seed layer 656 of growth template 113. In such embodiments, wherein the growth stack 682 is grown substantially fully strained, i.e., substantially free of strain relaxation, the growth stack 682 may inherit the lattice parameter of the GaN seed layer 656. In certain embodiments of the present disclosure, the GaN seed layer 656 may exhibit a growth plane lattice parameter of greater than or equal to about 3.186 Angstroms, and the growth stack 682 may exhibit a growth plane lattice parameter of greater than or equal to about 3.186 Angstroms. Therefore, in non-limiting examples, the semiconductor structures 100, 200, 300, 400 and 500 may be formed in such a manner to be composed of fully strained materials, and may have such a growth plan lattice parameter.

In further embodiments, the plurality of Group III nitride layers comprising the growth stack 682 of FIG. 6D, may be deposited in such a manner that the growth stack 682 is partially relaxed, i.e., the lattice parameter of the growth stack 682 differs from the underling GaN seed layer 656. In such embodiments the percentage strain relaxation (R) may be defined as:

$$R(\%) = \frac{a - a_s}{a_l - a_s} \times 100$$

where a is the average growth plane lattice parameter for the growth stack 682, $a_s$ is the average growth plane lattice parameter of the GaN seed, and $a_l$ is the equilibrium (or natural state) average growth plane lattice parameter for the growth stack 682. For example, in some embodiments, the growth stack 682 may exhibit a percentage strain relaxation (R) of less than about 0.5%, in further embodiments, the growth stack 682 may exhibit a percentage strain relaxation (R) of less than about 10% and, in yet further embodiments, the growth stack 682 may exhibit a percentage strain relaxation (R) of less than about 50%. After epitaxially depositing the various layers of the semiconductor structures that comprise Group III nitride materials, further processing may be applied to complete the fabrication of the semiconductor structures into light-emitting devices, such as LEDs. For example, electrode contacts may be formed on the layers of Group II nitride materials using processes known in the art and briefly described below with reference to FIG. 7 and FIG. 8.

Figure 7:
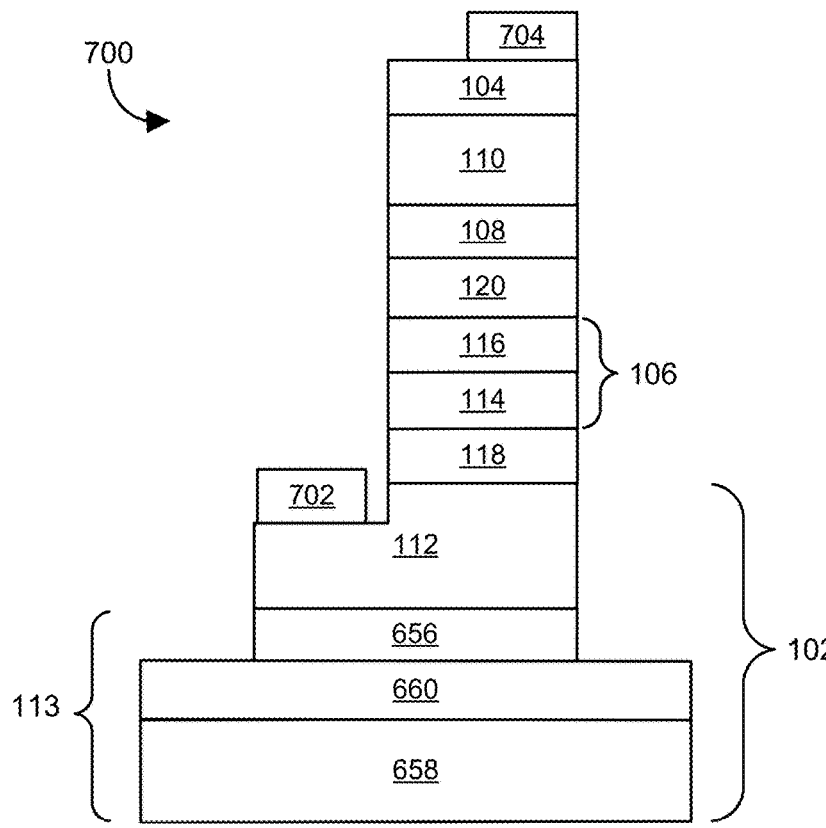
FIG. 7 is a partial cross-sectional side view of a light-emitting device fabricated from semiconductor structures in accordance with embodiments of methods of the present disclosure.

An example of a light-emitting device 700, such as a LED, fabricated from the semiconductor structure 100 is illustrated in FIG. 7. Although the following description describes embodiments for fabricating light-emitting devices from semiconductor structure 100, it should be noted that such fabrication processes may also be applied to the semiconductor structures 200, 300, 400 and 500.

In further detail, a portion of the semiconductor structure 100 may be removed thereby exposing a portion of the $In_nGa_{1-n}N$ base layer 112, in some embodiments, wherein the $In_nGa_{1-n}N$ base layer 112 is omitted and a portion of the semiconductor structure 100 may be removed to expose the GaN seed layer 656. The removal of a select portion of the semiconductor structure 100 may be realized by applying a photosensitive chemical to the exposed surface of the p-contact layer 104 of semiconductor structure 100 (not shown). Upon exposure to electromagnetic radiation through a patterned transparent plate and subsequent development, the photosensitive layer may be utilized as a "mask layer" to allow for select removal of the Group III nitride layers above the $In_nGa_{1-n}N$ base layer 112. Removal of select portions of the Group III nitride layers above the $In_nGa_{1-n}N$ base layer 112 may comprise an etching process, for example, a wet chemical etch and/or a dry plasma based etch (e.g., reactive ion etching, inductively coupled plasma etching).

A first electrode contact 702 may be formed over a portion of the exposed $In_nGa_{1-n}N$ base layer 112. The first electrode contact 702 may comprise one or more metals, which may include titanium, aluminum, nickel, gold and one or more alloys thereof. A second electrode contact 704 may be formed over a portion of the p-contact layer 104, the second electrode contact 704 may comprise one or more metals layers, which may include nickel, gold, platinum, silver and one or more alloys thereof. Upon formation of the first electrode contact 702 and the second electrode contact 704, current may be passed through the light-emitting device 700 to produce electromagnetic radiation, e.g., in the form of visible light. It should be noted that the light-emitting device 700 is commonly referred to as a "lateral device" in the art since at least of portion the current pathway between the first electrode contact 702 and the second electrode contact 704 comprises a lateral pathway.

A further example of a light-emitting device 800, such as a LED, fabricated from the semiconductor structure 100 is illustrated in FIG. 8, again although the following description describes embodiments for fabricating light-emitting devices from semiconductor structure 100, it should be noted that such fabrication processes may also be applied to the semiconductor structures 200, 300, 400 and 500.

In further detail, all or a portion of the growth template 113 may be removed from semiconductor structure 100 to enable exposure of either the GaN seed layer 656 layer or in some embodiments, to enable exposure of the $In_nGa_{1-n}N$ base layer 112. The removal of all or a portion of the growth template 113 may comprise one or more removal methods including wet etching, dry etching, chemical mechanical polishing, grinding and laser lift-off. Upon removal of all or a portion of the growth template 113, a first electrode contact 802 may be applied to the $In_nGa_{1-n}N$ base layer 112 as described hereinabove. Subsequently a second electrode contact 804 may be applied to a portion of the p-contact layer 104, thereby forming the light-emitting device 800. Upon formation of the first electrode contact 802 and the second electrode contact 804 current may be passed through the light-emitting device 800 to produce electromagnetic radiation, e.g., in the form of visible light. It should be noted that the light-emitting device 800 is commonly referred to as a "vertical device" in the art since the current pathway between the first electrode contact 802 and the second electrode contact 804 comprises a substantially vertical pathway.

In addition to the fabrication methods and processes described hereinabove for the fabrication of the non-limiting example light-emitting devices 700 and 800, it should be noted that additional methods and processes known in the art may also be utilized such as, for example, surface roughening to improve light extraction, bonding to metallic carriers to improve thermal dissipation, dicing and singulation, isolation, interconnection and the process known in the art as "flip-chip bonding" among other well-known fabrication methods.

Light-emitting devices, such as LEDs, according to embodiments of the present disclosure, may be fabricated and used in any type of light-emitting device that incorporates one or more LEDs therein. Embodiments of LEDs of the present disclosure may be particularly suitable for use in applications that benefit from LEDs that operate under relatively high power and that require relatively high luminosity. For example, LEDs of the present disclosure may be particularly suitable for use in LED lamps and LED-based light bulbs, which may be used for lighting buildings, street lighting, automotive lighting, etc.

Figure 8:
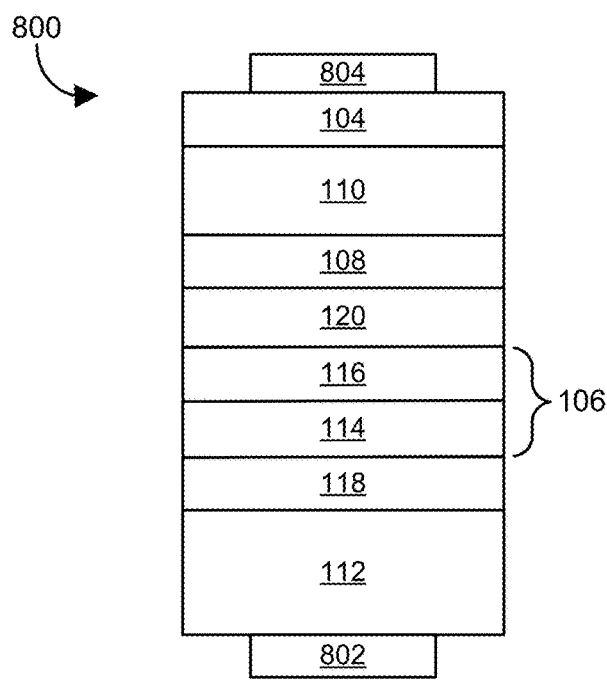
FIG. 8 is a partial cross-sectional side view of an additional light-emitting device fabricated from semiconductor structures in accordance with embodiments of methods of the present disclosure.

Additional embodiments of the present disclosure include luminary devices for emitting light that include one or more LEDs as described herein, such as the light-emitting device 700 of FIG. 7 and light-emitting device 800 of FIG. 8. As non-limiting examples, the luminary devices may be as described in, for example, U.S. Pat. No. 6,600,175, which issued Jul. 29, 2003 to Baretz et al., the disclosure of which is incorporated herein in its entirety by this reference, but including one or more LEDs as described herein.

Figure 14:
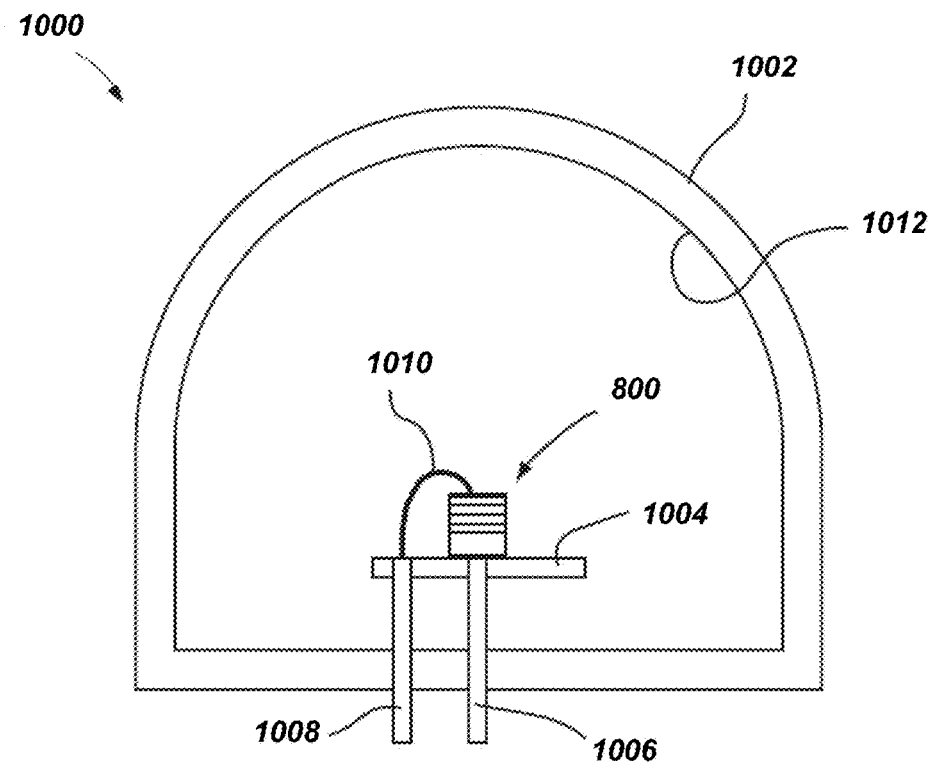
FIG. 14 illustrates an example of a luminary device that includes an LED of the present disclosure.

FIG. 14 illustrates an example embodiment of a luminary device 1000 of the present disclosure that includes a light-emitting device, such as device 700, 800 as described with reference to FIGS. 7 and 8. As shown in FIG. 14, the luminary device 1000 may include a container 1002, at least a portion of which is at least substantially transparent to electromagnetic radiation in the visible region of the electromagnetic radiation spectrum. The container 1002 may comprise, for example, an amorphous or crystalline ceramic material (e.g., a glass) or a polymeric material. The LED 800 is disposed within the container 1002, and may be mounted on a support structure 1004 (e.g., a printed circuit board or other substrate) within the container 1002. The luminary device 1000 further includes a first electrical contact structure 1006, and a second electrical contact structure 1008. The first electrical contact structure 1006 may be in electrical communication with one of the electrode contacts of the LED 800, such as the first electrode contact 802 (FIG. 8), and the second electrical contact structure 1008 may be in electrical communication with the other of the electrode contacts of the LED 800, such as the second electrode contact 804 (FIG. 8). As a non-limiting example, the first electrical contact structure 1006 may be in electrical communication with the first electrode contact 804 through the support structure 1004, and a wire 1010 may be used to electrically couple the second electrical contact structure 1008 with the second electrode contact 804. Thus, a voltage may be applied between the first electrical contact structure 1006 and the second electrical contact structure 1008 of the luminary device 1000 to provide a voltage and corresponding current between the first and second electrode contacts 802, 804 of the LED 800, thereby causing the LED to emit radiation.

The luminary device 1000, optionally, may further include a fluorescent or phosphorescent material that will itself emit electromagnetic radiation (e.g., visible light) when stimulated or excited by absorption of electromagnetic radiation emitted by the one or more LEDs 800 within the container 1002. For example, an inner surface 1012 of the container 1002 may be at least partially coated with such a fluorescent or phosphorescent material. The one or more LEDs 800 may emit electromagnetic radiation at one or more specific wavelengths, and the fluorescent or phosphorescent material may include a mixture of different materials that will emit radiation at different visible wavelengths, such that the luminary device 1000 emits white light outward from the container 1002. Various types of fluorescent and phosphorescent materials are known in the art and may be employed in embodiments of luminary devices of the present disclosure. For example, some such materials are disclosed in the aforementioned U.S. Pat. No. 6,600,175.

Additional non-limiting examples of embodiments of the disclosure are set forth below.

Embodiment 1: A semiconductor structure, comprising: a base layer; an active region disposed over the base layer, the active region comprising a plurality of layers of InGaN including at least one well layer comprising $In_wGa_{1-w}N$, wherein $0.10 \leq w \leq 0.40$, and at least one barrier layer comprising $In_bGa_{1-b}N$, wherein $0.01 \leq b \leq 0.10$; an electron blocking layer disposed over the active region on a side thereof opposite the base layer, the electron blocking layer comprising $In_eGa_{1-e}N$, wherein $0.00 \leq e \leq 0.02$; a p-type $In_pGa_{1-p}N$ bulk layer disposed over the electron blocking layer, wherein $0.01 \leq p \leq 0.08$; and a p-type $In_cGa_{1-c}N$ contact layer disposed over the p-type $In_pGa_{1-p}N$ bulk layer, wherein $0.00 \leq c \leq 0.10$.

Embodiment 2: The semiconductor structure of Embodiment 1, wherein the base layer further comprises a growth template, the growth template comprising: a growth substrate; and a GaN seed layer disposed on the growth substrate, wherein a growth plane of the GaN seed layer comprises a polar plane.

Embodiment 3: The semiconductor structure of Embodiment 1 or Embodiment 2, wherein the base layer further comprises an n-type $In_nGa_{1-n}N$ base layer, wherein $0.01 \leq n \leq 0.10$.

Embodiment 4: The semiconductor structure of any one of Embodiments 1 through 3, further comprising an $In_{sp}Ga_{1-sp}N$ spacer layer disposed between the active region and the base layer, wherein $0.01 \leq sp \leq 0.10$.

Embodiment 5: The semiconductor structure of any one of Embodiments 1 through 4, further comprising an $In_{cp}Ga_{1-cp}N$ cap layer disposed between the active region and the electron blocking layer, wherein $0.01 \leq cp \leq 0.10$.

Embodiment 6: The semiconductor structure of Embodiment 2, wherein the GaN seed layer has an average thickness of between about 1.0 μm and about 5 μm.

Embodiment 7: The semiconductor structure of Embodiment 2 or Embodiment 6, wherein the growth template further comprises a Group III nitride nucleation layer disposed between the growth substrate and the GaN seed layer.

Embodiment 8: The semiconductor structure of any one of Embodiments 1 through 7, wherein the active region has an average thickness of between about 40 nm and about 750 nm.

Embodiment 9: The semiconductor structure of any one of Embodiments 1 through 8, wherein the electron blocking layer is at least substantially comprised of GaN.

Embodiment 10: The semiconductor structure of any one of Embodiments 1 through 9, wherein the p-type $In_pGa_{1-p}N$ bulk layer has an average thickness of between about 50 nm and about 600 nm.

Embodiment 11: The semiconductor structure of Embodiment 10, wherein the p-type $In_pGa_{1-p}N$ bulk layer has an average thickness of about 175 nm.

Embodiment 12: The semiconductor structure of any one of Embodiments 1 through 11, wherein the p-type $In_cGa_{1-c}N$ contact layer is at least substantially comprised of GaN.

Embodiment 13: The semiconductor structure of any one of Embodiments 1 through 12, wherein a critical strain energy of the semiconductor structure is about 1800 (a.u.) or less.

Embodiment 14: The semiconductor structure of any one of Embodiments 1 through 13, wherein the base layer, the active region, the electron blocking layer, the p-type $In_pGa_{1-p}N$ bulk layer, and the p-type $In_cGa_{1-c}N$ contact layer define a growth stack exhibiting a percentage strain relaxation of less than 10%.

Embodiment 15: The semiconductor structure of any one of Embodiments 1 through 14, further comprising a first electrode contact over at least a portion of the base layer and a second electrode contact over at least a portion of the p-type $In_cGa_{1-c}N$ contact layer.

Embodiment 16: A light-emitting device, comprising: a base layer; an active region disposed over the base layer, the active region comprising a plurality of layers of InGaN, the plurality of layers of InGaN including at least one well layer, and at least one barrier layer disposed directly on the at least one well layer, an electron blocking layer disposed over the active region; a p-type $In_pGa_{1-p}N$ bulk layer disposed over the electron blocking layer; and a p-type $In_cGa_{1-c}N$ contact layer disposed over the p-type $In_pGa_{1-p}N$ bulk layer, wherein a critical strain energy of the light-emitting device is about 1800 (a.u.) or less.

Embodiment 17: The light-emitting device of Embodiment 16, wherein the base layer further comprises a growth template, the growth template comprising: a growth substrate; and a GaN seed layer disposed on the growth substrate, wherein a growth plane of the GaN seed layer comprises a polar plane.

Embodiment 18: The light-emitting device of Embodiment 16 or Embodiment 17, wherein the at least one well layer comprises $In_wGa_{1-w}N$, wherein $0.10 \le w \le 0.40$.

Embodiment 19: The light-emitting device of any one of Embodiments 16 through 18, wherein the at least one barrier layer comprises $In_bGa_{1-b}N$, wherein $0.01 \le b \le 0.10$.

Embodiment 20: The light-emitting device of any one of Embodiments 16 through 18, wherein the electron blocking layer is at least substantially comprised of GaN.

Embodiment 21: The light-emitting device of any one of Embodiments 16 through 20, wherein $0.01 \le p \le 0.08$ in the p-type $In_pGa_{1-p}N$ bulk layer.

Embodiment 22: The light-emitting device of any one of Embodiments 16 through 21, wherein $0.01 \le c \le 0.10$ in the p-type $In_cGa_{1-c}N$ contact layer.

Embodiment 23: The light-emitting device of any one of Embodiments 16 through 22, wherein the p-type $In_cGa_{1-c}N$ contact layer is substantially comprised of GaN.

Embodiment 24: The light-emitting device of any one of Embodiments 16 through 23, further comprising a first electrode contact over at least a portion of the base layer and a second electrode contact over at least a portion of the p-type $In_cGa_{1-c}N$ contact layer.

Embodiment 25: The light-emitting device of any one of Embodiments 16 through 24, wherein the active region, the electron blocking layer, the p-type $In_pGa_{1-p}N$ bulk layer, and the p-type $In_cGa_{1-c}N$ contact layer together define a growth stack exhibiting a percentage strain relaxation of less than 1%.

Embodiment 26: A method of forming a semiconductor structure, comprising: providing a base layer, growing a plurality of layers of InGaN to form an active region over the base layer, growing the plurality of layers of InGaN including growing at least one $In_wGa_{1-w}N$ well layer, wherein $0.10 \le w \le 0.40$, and growing at least one $In_bGa_{1-b}N$ barrier layer, wherein $0.01 \le b \le 0.10$; growing an electron blocking layer over the active region on a side thereof opposite the base layer, growing a p-type $In_pGa_{1-p}N$ bulk layer over the electron blocking layer, wherein $0.01 \le p \le 0.08$; and growing a p-type $In_cGa_{1-c}N$ contact layer over the p-type $In_pGa_{1-p}N$ bulk layer, wherein $0.00 \le c \le 0.10$.

Embodiment 27: The method of Embodiment 26, wherein providing the base layer further comprises forming a growth template, forming the growth template comprising: providing a growth substrate; and growing a GaN seed layer over the growth substrate, wherein a growth plane of the GaN seed layer is a polar plane.

Embodiment 28: The method of Embodiment 26 or Embodiment 27, wherein providing the base layer further comprises growing an n-type $In_nGa_{1-n}N$ base layer, wherein $0.01 \le n \le 0.10$.

Embodiment 29: The method of any one of Embodiments 26 through 28, further comprising growing an $In_pGa_{1-p}N$ spacer layer disposed between the active region and the base layer, wherein $0.01 \le sp \le 0.10$.

Embodiment 30: The method of any one of Embodiments 26 through 29, further comprising growing an $In_pGa_{1-p}N$ cap layer disposed between the active region and electron blocking layer, wherein $0.01 \le cp \le 0.10$.

Embodiment 31: The method of Embodiment 27, further comprising growing the GaN seed layer to an average layer thickness in a range extending from about 1.0 μm to about 7 μm.

Embodiment 32: The method of Embodiment 27 or Embodiment 31, wherein forming the growth template further comprises depositing a Group III nitride nucleation layer disposed between the growth substrate and the GaN seed layer.

Embodiment 33: The method of any one of Embodiments 26 through 32, further comprising growing the active region to have an average thickness between about 40 nm and about 750 nm.

Embodiment 34: The method of any one of Embodiments 26 through 33, further comprising growing the electron blocking layer to be at least substantially comprised of GaN.

Embodiment 35: The method of any one of Embodiments 26 through 34, further comprising growing the p-type $In_pGa_{1-p}N$ bulk layer to have an average layer thickness of between about 50 nm and about 600 nm.

Embodiment 36: The method of any one of Embodiments 26 through 35, further comprising growing the p-type $In_cGa_{1-c}N$ contact layer to be at least substantially comprised of GaN.

Embodiment 37: The method of any one of Embodiments 26 through 36, further comprising forming the base layer, the active region, the electron blocking layer, the p-type $In_pGa_{1-p}N$ bulk layer, and the p-type $In_cGa_{1-c}N$ contact layer to define a growth stack exhibiting a percentage strain relaxation of less than 1%.

Embodiment 38: The method of Embodiment 37, further comprising forming the growth stack to have a critical strain energy of about 1800 (a.u.) or less.

Embodiment 39: The method of any one of Embodiments 26 through 38, further comprising growing each of the active region, the electron blocking layer, the p-type $In_pGa_{1-p}N$ bulk layer, and the p-type $In_cGa_{1-c}N$ contact layer in a single chemical vapor deposition system at a pressure or pressures between about 50 mTorr and about 500 mTorr.

Embodiment 40: The method of any one of Embodiments 26 through 39, further comprising growing the p-type $In_pGa_{1-p}N$ bulk layer in a chamber while flowing trimethylindium (TMI) and triethylgallium (TMG) through the chamber, wherein a flow ratio (%) of the flow rate of the trimethylindium (TMI) to a flow rate of the triethylgallium (TMG) is between about 50% and about 95%.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A semiconductor structure, comprising:
   a base region comprising:
      a growth substrate; and
      a GaN seed region disposed on the growth substrate, wherein a growth plane of the GaN seed region comprises a polar plane;
   an active region proximate the base region, the active region comprising a plurality of volumes of InGaN including at least one well region comprising $In_wGa_{1-w}N$, and at least one barrier region comprising $In_bGa_{1-b}N$;
   an electron blocking region proximate the active region on a side thereof opposite the base region;
   a p-type $In_pGa_{1-p}N$ bulk region proximate the electron blocking region on a side thereof opposite the active region; and
   a p-type $In_cGa_{1-c}N$ contact region proximate the p-type $In_pGa_{1-p}N$ bulk region on a side thereof opposite the electron blocking region.

2. The semiconductor structure of claim 1, wherein $0.10 \leq w \leq 0.40$ in the at least one well region.

3. The semiconductor structure of claim 1, wherein $0.01 \leq b \leq 0.10$ in the at least one barrier region.

4. The semiconductor structure of claim 1, wherein the electron blocking region comprises $In_eGa_{1-e}N$, wherein $0.00 \leq e \leq 0.02$.

5. The semiconductor structure of claim 1, wherein $0.01 \leq p \leq 0.08$ in the p-type $In_pGa_{1-p}N$ bulk region.

6. The semiconductor structure of claim 1, wherein $0.00 \leq c \leq 0.10$ in the p-type $In_pGa_{1-p}N$ contact region.

7. The semiconductor structure of claim 1, wherein the growth template further comprises a Group III nitride nucleation region disposed between the growth substrate and the GaN seed region.

8. The semiconductor structure of claim 1, wherein the base region further comprises an n-type $In_nGa_{1-n}N$ base region, wherein $0.01 \leq n \leq 0.10$.

9. The semiconductor structure of claim 1, wherein the electron blocking region is at least substantially comprised of GaN.

10. The semiconductor structure of claim 1, wherein the p-type $In_cGa_{1-c}N$ contact region is at least substantially comprised of GaN.

11. The semiconductor structure of claim 1, wherein a critical strain energy of the semiconductor structure is about 1800 (a.u.) or less.

12. A method of making a semiconductor structure, comprising:
   forming a base region to include:
      a growth substrate; and
      a GaN seed region disposed on the growth substrate, wherein a growth plane of the GaN seed region comprises a polar plane;
   forming an active region proximate the base region, the active region comprising a plurality of volumes of InGaN including at least one well region comprising $In_wGa_{1-w}N$, and at least one barrier region comprising $In_bGa_{1-b}N$;
   forming an electron blocking region proximate the active region on a side thereof opposite the base region;
   forming a p-type $In_pGa_{1-p}N$ bulk region proximate the electron blocking region on a side thereof opposite the active region;
   forming a p-type $In_cGa_{1-c}N$ contact region proximate the p-type $In_pGa_{1-p}N$ bulk region on a side thereof opposite the electron blocking region; and
   rendering a critical strain energy of the semiconductor structure about 1800 (a.u.) or less.

13. The method of claim 12, further comprising selecting the $In_wGa_{1-w}N$ of the at least one well region to be $0.10 \leq w \leq 0.40$.

14. The method of claim 12, further comprising selecting the $In_bGa_{1-b}N$ of the at least one barrier region to be $0.01 \leq b \leq 0.10$.

15. The method of claim 12, further comprising selecting a material of the electron blocking region to comprise $In_eGa_{1-e}N$, wherein $0.00 \leq e \leq 0.02$.

16. The method of claim 12, further comprising selecting the p-type $In_pGa_{1-p}N$ bulk region to be $0.01 \leq p \leq 0.08$.

17. The method of claim 12, further comprising selecting the p-type $In_pGa_{1-p}N$ contact region to be $0.00 \leq c \leq 0.10$.

18. The method of claim 12, further comprising selecting the base region to comprise an n-type $In_nGa_{1-n}N$ base region, wherein $0.01 \leq n \leq 0.10$.

19. The method of claim 12, further comprising selecting a material of the electron blocking region to be at least substantially comprised of GaN.

* * * * *

UNITED STATES PATENT AND TRADEMARK OFFICE
CERTIFICATE OF CORRECTION

PATENT NO. : 9,978,905 B2
APPLICATION NO. : 15/141472
DATED : May 22, 2018
INVENTOR(S) : Jean-Philippe Debray, Chantal Arena and Heather McFavilen Page 1 of 1

It is certified that error appears in the above-identified patent and that said Letters Patent is hereby corrected as shown below:

In the Specification

| | | |
|---|---|---|
| Column 14, | Line 55, | change "to about $1e^{12}$ cm$^{-3}$." to --to about $1e^{21}$ cm$^{-3}$.-- |
| Column 20, | Line 3, | change "band-gap energy 550" to --band-gap energy 550$_B$-- |
| Column 24, | Line 22, | change "$In_{0.08}Ga_{0.95}N$ having an" to --$In_{0.05}Ga_{0.95}N$ having an-- |
| Column 27, | Lines 48, 49, | change "(%) oftrimethyl-indium" to --(%) of trimethyl-indium-- |
| Column 30, | Line 1, | change "Group II nitride" to --Group III nitride-- |
| Column 33, | Line 33, | change "one well layer," to --one well layer;-- |
| Column 34, | Line 18, | change "base layer, growing" to --base layer; growing-- |

Signed and Sealed this
Seventeenth Day of July, 2018

Andrei Iancu
*Director of the United States Patent and Trademark Office*